(12) United States Patent
Ross

(10) Patent No.: US 6,437,433 B1
(45) Date of Patent: Aug. 20, 2002

(54) CSP STACKING TECHNOLOGY USING RIGID/FLEX CONSTRUCTION

(76) Inventor: Andrew C. Ross, 1300 Ash St., Ramona, CA (US) 92065

( * ) Notice: Subject to any disclaimer, the term of this patent is extended or adjusted under 35 U.S.C. 154(b) by 0 days.

(21) Appl. No.: 09/535,641

(22) Filed: Mar. 24, 2000

(51) Int. Cl.$^7$ .......................... H01L 23/48; H01L 23/52
(52) U.S. Cl. ..................... 257/692; 257/698; 438/125
(58) Field of Search .............................. 257/784, 786, 257/692, 698, 693; 438/666, 125, 108

(56) References Cited

U.S. PATENT DOCUMENTS

| | | | |
|---|---|---|---|
| 3,746,934 A | 7/1973 | Stein | 317/101 CM |
| 4,956,964 A | 9/1990 | Eide | 357/74 |
| 5,198,888 A | 3/1993 | Sugano et al. | 257/686 |
| 5,514,907 A | 5/1996 | Moshayedi et al. | 257/723 |
| 5,612,570 A | 3/1997 | Eide et al. | 257/686 |
| 5,869,353 A | 2/1999 | Levy et al. | 438/109 |

FOREIGN PATENT DOCUMENTS

JP          4409562          7/1992

Primary Examiner—Sheila V. Clark
(74) Attorney, Agent, or Firm—Stetina Brunda Garred & Brucker

(57) ABSTRACT

A stackable integrated circuit chip package comprising an interconnect sub-assembly which includes an interconnect substrate having first, second and third conductive pad arrays disposed thereon. The interconnect sub-assembly also includes a first rail member which is attached to the interconnect substrate and has a fourth conductive pad array disposed thereon, and a second rail member which is also attached to the interconnect substrate and has a fifth conductive pad array disposed thereon. The fourth and fifth conductive pad arrays are electrically connected to respective ones of the second and third conductive pad arrays of the interconnect substrate. In addition to the interconnect sub-assembly, the chip package of the present invention includes an integrated circuit chip which is electrically connected to the first conductive pad array of the interconnect substrate of the interconnect sub-assembly.

57 Claims, 6 Drawing Sheets

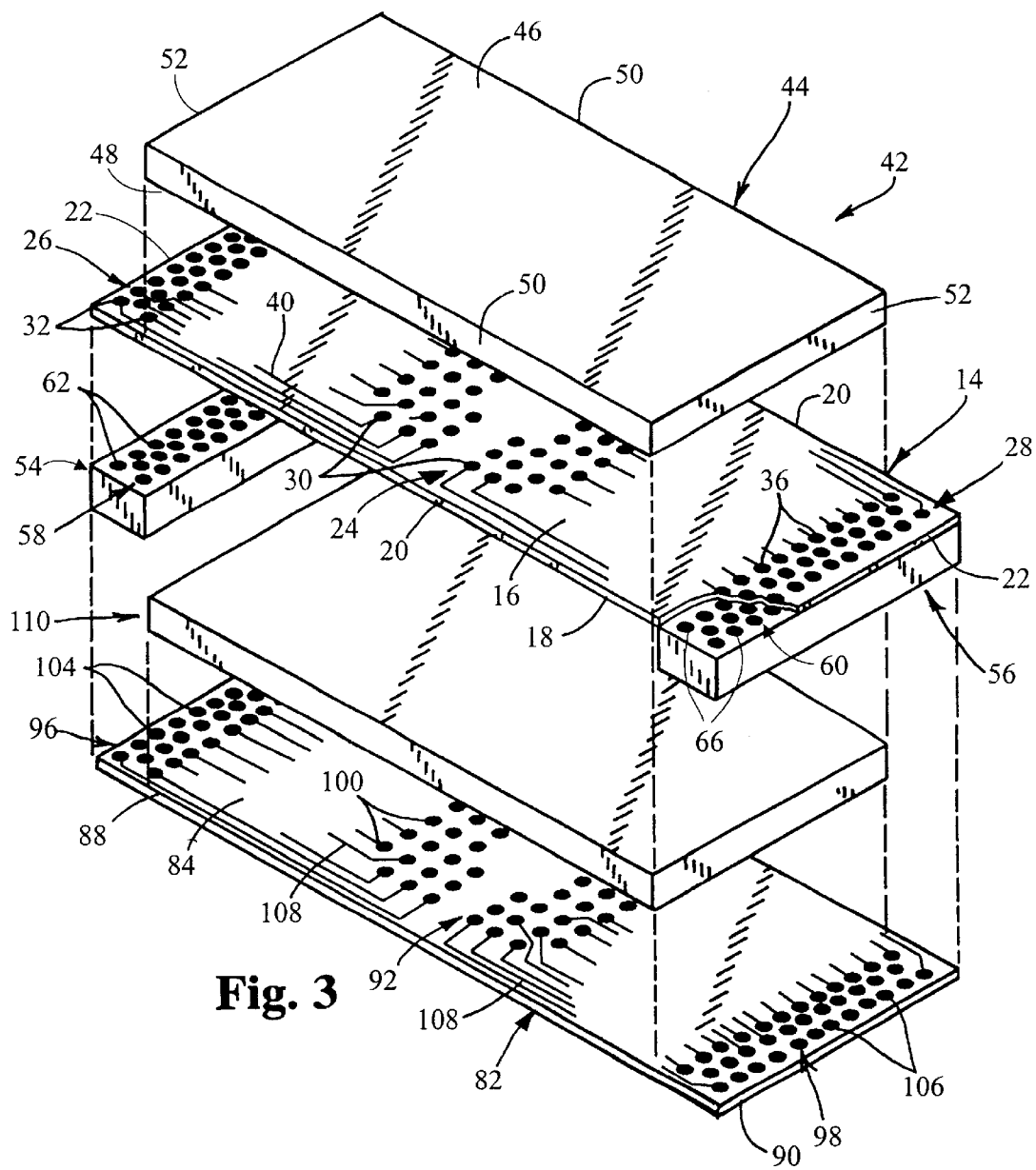

CSP STACKING TECHNOLOGY USING RIGID/FLEX CONSTRUCTION

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention relates generally to chip stacks, and more particularly to a stackable integrated circuit chip package having a rail configuration which allows multiple chip packages to be quickly, easily and inexpensively assembled into a chip stack having a minimal profile.

Multiple techniques are currently employed in the prior art to increase memory capacity on a printed circuit board. Such techniques include the use of larger memory chips, if available, and increasing the size of the circuit board for purposes of allowing the same to accommodate more memory devices or chips. In another technique, vertical plug-in boards are used to increase the height of the circuit board to allow the same to accommodate additional memory devices or chips.

Perhaps one of the most commonly used techniques to increase memory capacity is the stacking of memory devices into a vertical chip stack, sometimes referred to as 3D packaging or Z-Stacking. In the Z-Stacking process, from two (2) to as many as eight (8) memory devices or other integrated circuit (IC) chips are interconnected in a single component (i.e., chip stack) which is mountable to the "footprint" typically used for a single package device such as a packaged chip. The Z-Stacking process has been found to be volumetrically efficient, with packaged chips in TSOP (thin small outline package) or LCC (leadless chip carrier) form generally being considered to be the easiest to use in relation thereto. Though bare dies or chips may also be used in the Z-Stacking process, such use tends to make the stacking process more complex and not well suited to automation.

In the Z-Stacking process, the IC chips or packaged chips must, in addition to being formed into a stack, be electrically interconnected to each other in a desired manner. There is known in the prior art various different arrangements and techniques for electrically interconnecting the IC chips or packaged chips within a stack. Examples of such arrangements and techniques are disclosed in Applicant's U.S. Pat. No. 4,956,694 entitled INTEGRATED CIRCUIT CHIP STACKING issued Sep. 11, 1990, U.S. Pat. No. 5,612,570 entitled CHIP STACK AND METHOD OF MAKING SAME issued Mar. 18, 1997, and U.S. Pat. No. 5,869,353 entitled MODULAR PANEL STACKING PROCESS issued Feb. 9, 1999.

The various arrangements and techniques described in these issued patents and other currently pending patent applications of Applicant have been found to provide chip stacks which are relatively easy and inexpensive to manufacture, and are well suited for use in a multitude of differing applications. The present invention provides yet a further alternative arrangement and technique for forming a chip stack which involves the use of stackable integrated circuit chip packages which each include a rail configuration. The inclusion of rail members in the chip packages of the present invention provides numerous advantages in the assembly of the chip stack, including significantly greater simplicity in such assembly.

BRIEF SUMMARY OF THE INVENTION

In accordance with a first embodiment of the present invention, there is provided a stackable integrated circuit chip package comprising an interconnect sub-assembly. The interconnect sub-assembly itself comprises an interconnect substrate which defines opposed, generally planar top and bottom surfaces. The interconnect substrate preferably has a generally rectangular configuration defining a pair of longitudinal peripheral edge segments and a pair of lateral peripheral edge segments. The interconnect substrate is preferably flexible, though the same may alternatively be of rigid construction. If flexible, the interconnect substrate is preferably fabricated from a polyamide. If of rigid construction, the interconnect substrate is preferably fabricated from a ceramic material.

Disposed on the interconnect substrate are first, second and third conductive pad arrays, with the second and third pad arrays extending along respective ones of the lateral peripheral edge segments of the interconnect substrate and being disposed on opposite sides of the first conductive pad array. Additionally, the second and third conductive pad arrays are each electrically connected to the first conductive pad array. The electrical connection of the second and third conductive pad arrays to the first conductive pad array is preferably facilitated by conductive tracings which are formed in accordance with conventional etching techniques.

In the chip package of the first embodiment, the first conductive pad array comprises a first set of pads disposed on the top surface of the interconnect substrate, with the second conductive pad array comprising second and third sets of pads disposed on respective ones of the top and bottom surfaces and arranged in identical patterns such that the pads of the second set are aligned with respective ones of the pads of the third set. Similar to the second conductive pad array, the third conductive pad array comprises fourth and fifth sets of pads disposed on respective ones of the top and bottom surfaces and arranged in identical patterns such that the pads of the fourth set are aligned with respective ones of the pads of the fifth set. The pads of the second set are electrically connected to respective ones of the pads of the third set, with the pads of the fourth set being electrically connected to respective ones of the pads of the fifth set. Such electrical connection may be facilitated through the use of vias extending through the interconnect substrate or conductive tracings which extend about the lateral peripheral edge segments thereof.

The interconnect sub-assembly of the chip package of the first embodiment further comprises first and second identically configured rail members which are each attached to the interconnect substrate. The first and second rail members each have a generally rectangular configuration and define opposed, generally planar top and bottom surfaces. Disposed on the first rail member is a fourth conductive pad array, while disposed on the second rail member is a fifth conductive pad array. The fourth and fifth conductive pad arrays are electrically connected to respective ones of the second and third conductive pad arrays.

The fourth conductive pad array itself preferably comprises sixth and seventh sets of pads which are disposed on respective ones of the top and bottom surfaces of the first rail member and arranged in identical patterns such that the pads of the sixth set are aligned with respective ones of the pads of the seventh set. Similarly, the fifth conductive pad array preferably comprises eighth and ninth sets of pads which are disposed on respective ones of the top and bottom surfaces of the second rail member and arranged in identical patterns such that the pads of the eighth set are aligned with respective ones of the pads of the ninth set. The pads of the sixth set are electrically connected to respective ones of the pads of the seventh set, with the pads of the eighth set being electrically connected to respective ones of the pads of the ninth set. In the chip package of the first embodiment, the pads of the second through fifth sets (which are disposed upon the interconnect substrate), the pads of the sixth and seventh sets (which are disposed upon the first rail member) and the pads of the eighth and ninth sets (which are disposed upon the second rail member) are arranged in identical patterns.

The interconnect sub-assembly of the chip package of the first embodiment is preferably assembled by attaching the first and second rail members to the interconnect substrate such that either the sixth or seventh sets of pads of the first rail member are electrically connected to respective ones of those pads of the second conductive pad array which are disposed on the bottom surface of the interconnect substrate, and either the eight or ninth sets of pads of the second rail member are electrically connected to respective ones of those pads of the third conductive pad array which are disposed on the bottom surface of the interconnect substrate. The electrical connections between the first and second rail members and the interconnect substrate in the interconnect subassembly, and more particularly between the fourth and fifth conductive pad arrays and respective ones of the second and third conductive pad arrays, may be facilitated through either the use of solder or an adhesive such as a conductive epoxy or a z-axis adhesive.

In addition to the interconnect sub-assembly, the chip package of the first embodiment comprises an integrated circuit chip which is electrically connected to the first conductive pad array, and hence to the second and third conductive pad arrays by virtue of their electrical connection to the first conductive pad array. The integrated circuit chip preferably comprises a flip chip device or a fine pitch BGA (ball grid array) device having a body which is of a generally rectangular configuration defining opposed, generally planar top and bottom surfaces, a pair of longitudinal sides, and a pair of lateral sides. Protruding from the bottom surface of the body are a plurality of generally semi-spherically shaped conductive contacts which are preferably arranged in an identical pattern to the first set of pads. The electrical connection of the integrated circuit chip to the first conductive pad array is preferably facilitated by soldering the conductive contacts of the integrated circuit chip to respective ones of the pads of the first set. The integrated circuit chip is preferably sized relative to the interconnect substrate of the interconnect sub-assembly such that when the conductive contacts are electrically connected (e.g., soldered) to respective ones of the pads of the first set, the longitudinal sides of the body are substantially flush with respective ones of the longitudinal peripheral edge segments of the interconnect substrate, with the lateral sides of the body being disposed in spaced relation to respective ones of the lateral peripheral edge segments of the interconnect substrate so as not to cover any portion of the second-and third conductive pad arrays extending therealong.

In assembling the chip package of the first embodiment, the conductive contacts of the integrated circuit chip are electrically connected to respective ones of the pads of the first set comprising the first conductive pad array of the interconnect substrate of the interconnect sub-assembly. Such electrical connection is also preferably facilitated through either a soldering or adhesive bonding process.

In accordance with a modified version of the first embodiment, the interconnect substrate may include a pair of heat dissipating fin portions protruding laterally from respective ones of the longitudinal peripheral edge segments thereof. In this modified version, the interconnect substrate preferably comprises top, middle and bottom layers disposed in laminar juxtaposition to each other, with the top and bottom layers being fabricated from a polymer material and the middle layer being fabricated from a metallic material and defining the fin portions. When the fin portions are included on the interconnect substrate, the chip package may further comprise a pair of heat dissipation members which are attached to respective ones of the fin portions.

Further in accordance with the present invention, there is provided a chip stack comprising at least two of the above-described stackable integrated circuit chip packages. In the present chip stack, the chip packages are assembled such that the fourth and fifth conductive pad arrays of the first and second rail members of the interconnect sub-assembly of one of the chip packages within the chip stack are electrically connected to respective ones of the second and third conductive pad arrays of the interconnect substrate of the interconnect sub-assembly of another chip package within the chip stack. More particularly, those pads of the fourth and fifth conductive pad arrays of one of the chip packages in the stack which are not electrically connected to the interconnect substrate thereof are electrically connected to respective ones of those pads of the second and third conductive pad arrays of another chip package within the chip stack which are disposed on the top surface of the interconnect substrate of the interconnect sub-assembly thereof.

In addition to one or more chip packages, the chip stack of the present invention comprises a base package which includes a generally rectangular interconnect substrate defining opposed, generally planar top and bottom surfaces, a pair of longitudinal peripheral edge segments, and a pair of lateral peripheral edge segments. Disposed on the top surface of the interconnect substrate of the base package is a sixth conductive pad array, while disposed on the bottom surface thereof is a seventh conductive pad array which is identically configured to the sixth conductive pad array and electrically connected thereto. In addition to being identically configured to each other, the sixth and seventh conductive pad arrays are identically configured to the first conductive pad array of the chip package(s) within the chip stack. Also disposed on the top surface of the interconnect substrate of the base package are eighth and ninth conductive pad arrays which extend along respective ones of the lateral peripheral edge segments and are disposed on opposite sides of the sixth conductive pad array. The eighth and ninth conductive pad arrays are each electrically connected to the sixth conductive pad array, with such electrical connection preferably being facilitated via conductive tracings which are formed in accordance with conventional etching techniques. The eighth and ninth conductive pad arrays of the base package are identically configured to the second, third, fourth and fifth conductive pad arrays of the chip package(s) in the chip stack.

In the interconnect substrate of the base package, the sixth conductive pad array comprises a tenth set of pads, with the seventh conductive pad array comprising an eleventh set of pads which are arranged in an identical pattern to the tenth set of pads such that the pads of the tenth set are aligned with respective ones of the pads of the eleventh set. The pads of the tenth set are electrically connected to respective ones of the pads of the eleventh set through the use of, for example, vias which extend through the interconnect substrate of the base package.

In addition to the interconnect substrate, the base package of the chip stack comprises an integrated circuit chip which electrically connected to the sixth conductive pad array. The integrated circuit chip of the base package is configured identically to the integrated circuit chip of the chip package (s) in the chip stack, with the electrical connection to the interconnect substrate preferably being facilitated by soldering the conductive contacts of the integrated circuit chip to respective ones of the pads of the tenth set. The interconnect substrate of the base package may also be of either a flexible or rigid construction.

In assembling the chip stack of the present invention, the fourth and fifth conductive pad arrays of the first and second rail members of the interconnect sub-assembly of the lowermost chip package in the chip stack are electrically connected to respective ones of the eighth and ninth conductive pad arrays of the base package. More particularly, those pads of the fourth and fifth conductive pad arrays of the lowermost chip package which are not electrically connected to the interconnect substrate of the interconnect sub-assembly thereof are electrically connected to respective ones of the pads of the eighth and ninth conductive pad arrays of the base package which are disposed on the top surface of the interconnect substrate thereof. In a preferred embodiment, the chip stack includes more than two chip packages which are stacked upon a base package.

In accordance with a second embodiment of the present invention, there is provided a stackable integrated circuit chip package comprising an interconnect sub-assembly. The interconnect sub-assembly itself comprises on interconnect substrate which has a generally rectangular configuration and defines opposed, generally planar top and bottom surfaces, a pair of longitudinal peripheral edge segments, and a pair of lateral peripheral edge segments. Similar to the interconnect substrate of the chip package of the first embodiment, the interconnect substrate of the interconnect sub-assembly of the chip package of the second embodiment may be of either flexible or rigid construction. If flexible, the interconnect substrate is preferably fabricated from a polyamide. If of rigid construction, the interconnect substrate is preferably fabricated from a ceramic material.

Disposed on the interconnect substrate are first and second conductive pad arrays, with the second conductive pad array extending along the longitudinal and lateral peripheral edge segments. The second conductive pad array is electrically connected to the first conductive pad array, with such electrical connection preferably being facilitated by conductive tracings which are formed in accordance with conventional etching techniques. The first conductive pad array preferably comprises a first set of pads disposed on the top surface of the interconnect substrate, with the second conductive pad array preferably comprising second and third sets of pads disposed on respective ones of the top and bottom surfaces and arranged in identical patterns such that the pads of the second set are aligned with respective ones of the pads of the third set. The pads of the second set are electrically connected to respective ones of the pads of the third set either through the use of vias extending through the interconnect substrate or conductive tracings which extend about the longitudinal and lateral peripheral edge segments thereof.

The interconnect sub-assembly of the chip package of the second embodiment further comprises first and second identically configured rail member which are each attached to the interconnect substrate. The first rail member has a third conductive pad array disposed thereon, with the second rail member having a fourth conductive pad array disposed thereon. The third and fourth conductive pad arrays of the first and second rail members are each electrically connected to the second conductive pad array, and hence the first conductive pad array.

In addition to the interconnect sub-assembly, the chip package of the second embodiment includes an integrated circuit chip which is electrically connected to the first conductive pad array. The integrated circuit chip is identically configured to that previously described in relation to the first embodiment, with the semi-spherically shaped conductive contacts thereof being arranged on the bottom surface of the body in an identical pattern to the first set of pads comprising the first conductive pad array. In this respect, the electrical connection of the integrated circuit chip to the first conductive pad array is preferably facilitated by soldering or adhesively securing the conductive contacts to respective ones of the pads of the first set. In the second embodiment, the integrated circuit chip is sized relative to the interconnect substrate such that the longitudinal sides of the body of the integrated circuit chip are disposed in spaced relation to respective ones of the longitudinal peripheral edge segments of the interconnect substrate of the interconnect sub-assembly. Additionally, the lateral sides of the body of the integrated circuit chip are disposed in spaced relation to respective ones of the lateral peripheral edge segments of the interconnect substrate such that the body does not cover any portion of the second conductive pad array which extends about the body of the integrated circuit chip.

Still further in accordance with the present invention, there is provided a method of assembling a stackable integrated circuit chip package. The method comprises the initial step of electrically connecting an integrated circuit chip to a conductive pattern on an interconnect substrate through the use of a soldering process/technique or alternatively through the use of an adhesive such as a conductive epoxy or a z-axis adhesive. Thereafter, first and second rail members are electrically connected to the conductive pattern such that the first and second rail members are electrically connectable to at least one other stackable integrated circuit chip package. More particularly, the first and second rail members each include a conductive pattern thereon, with the conductive patterns of the first and second rail members being soldered to the conductive pattern of the interconnect substrate.

Still further in accordance with the present invention, there is provided a method of assembling a chip stack. The method comprises the initial step of providing a plurality of panels which each have opposed, generally planar surfaces, a plurality of openings disposed therein, and a plurality of conductive pads disposed on the opposed surfaces thereof. Also provided in the present method are a plurality of substrate sheets which each have opposed, generally planar surfaces and a plurality of conductive pads disposed on at least one of the opposed surfaces thereof, and a plurality of integrated circuit chips which each have opposed, generally planar sides and include conductive contacts protruding from one of the opposed sides thereof.

In the chip stack assembly method, one of the panels is stacked upon one of the substrate sheets such that at least some of the conductive pads of the panel are disposed on at least some of the conductive pads of the substrate sheet. Thereafter, integrated circuit chips are placed into respective ones of the openings of the panel such that the conductive contacts of each of the integrated circuit chips are disposed on at least some of the conductive pads of the substrate sheet. Another substrate sheet is then stacked upon the panel such that the substrate sheet covers the openings of the panel and the integrated circuit chips therewithin, and at least some of the conductive pads of the substrate sheet are disposed on at least some of the conductive pads of the panel. Integrated circuit chips are then placed upon the substrate sheet such that at least some of the conductive contacts of the integrated circuit chips are disposed on at least some of the conductive pads of the substrate sheet. The stacking and placement steps may be repeated depending on the desired size/height of the chip stack. Finally, the conductive contacts of the integrated-circuit chips are bonded to at least some of the conductive pads of the substrate sheet upon which the integrated circuit chips are positioned, with at least some of the conductive pads of each of the substrate sheets being bonded to at least some of the conductive pads of at least one of the panels. Such bonding is preferably facilitated through the use of solder or an adhesive such as a conductive epoxy or a z-axis adhesive which is pre-applied to the conductive contacts and/or conductive pads and facilitates the bonding/electrical connections therebetween when the assembled chip stack is exposed to a high level of heat (e.g., placed into an oven).

Still further in accordance with the present invention, there is provided another method of assembling a chip stack. The method comprises the initial step of providing a plurality of panel assemblies, each of which includes a panel having opposed, generally planar surfaces, a plurality of openings disposed therein, and a plurality of conductive pads disposed on the opposed surfaces thereof. Also included in each panel assembly is a substrate sheet which has opposed, generally planar surfaces and a plurality of conductive pads disposed on at least one of the opposed surfaces thereof. The panel and substrate sheet are attached to each other such that at least some of the conductive pads of the panel are electrically connected to at least some of the conductive pads of the substrate sheet. Also provided in this alternative method are a plurality of shim sheets which each have opposed, generally planar surfaces, and a plurality of intergrated circuit chips which each have opposed, generally planar sides and include conductive contacts protruding from one of the opposed sides thereof.

In the alternative chip stack assembly method, the intergrated circuit chips may be placed into respective ones of the openings of the panel of one of the panel assemblies. Thereafter, a shim sheet is stacked upon the panel assembly such that the shim sheet is in abutting contact with the panel of the panel assembly and the integrated circuit chips and conductive pads of the panel assembly are aligned with respective ones of the openings of the shim sheet and are not covered thereby. Another panel assembly is then stacked upon the shim sheet such that the substrate sheet of the subsequently stacked panel assembly is in direct contact with the shim sheet and at least some of the conductive pads of such substrate sheet are in aligned contact with the conductive contacts of the integrated circuit chips. Integrated circuit chips are then placed upon the substrate sheet in the stack which is not in abutting contact with any shim sheet. The stacking and placement steps may be repeated depending on the desired size/height of the chip stack. Finally, the conductive contacts of the integrated circuit chips are bonded to at least some of the conductive pads of the substrate sheet upon which the integrated circuit chips are positioned, with at least some of the conductive pads of the panel assemblies being bonded to each other. Such bonding may be facilitated through the use of solder or an adhesive such as a conductive epoxy or z-axis adhesive which is pre-applied to the conductive contacts and/or conductive pads and facilitates the bonding/electrical connections therebetween when the assembled chip stack is exposed to a high level of heat.

BRIEF DESCRIPTION OF THE DRAWINGS

These, as well as other features of the present invention, will become more apparent upon reference to the drawings wherein:

FIG. 3 is an exploded view of the chip stack shown in FIG. 1;

DETAILED DESCRIPTION OF THE INVENTION

Figure 1:
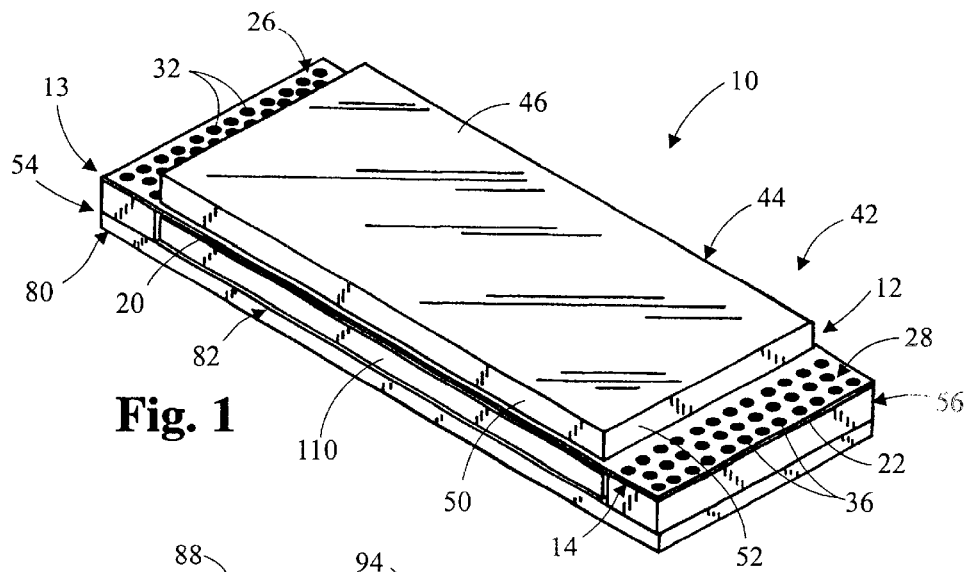
FIG. 1 is a top perspective view of a chip stack including a base package and a chip package which are each constructed in accordance with a first embodiment of the present invention.

Referring now to the drawings wherein the showings are for purposes of illustrating preferred embodiments of the present invention only, and not for purposes of limiting the same, FIG. 1 perspectively illustrates a chip stack 10 of the present invention which includes a stackable integrated circuit chip package 12 constructed in accordance with a first embodiment thereof. Referring now to FIGS. 1–3 and 3A, the chip package 12 comprises an interconnect sub-assembly 13. The interconnect sub-assembly 13 itself comprises an interconnect substrate 14 which defines a generally planar top surface 16 and a generally planar bottom surface 18. The interconnect substrate 14 preferably has a generally rectangular configuration defining a pair of longitudinal peripheral edge segments 20 and a pair of lateral peripheral edge segments 22. The interconnect substrate 14 is preferably flexible, though the same may alternatively be of rigid construction. If flexible, the interconnect substrate 14 is preferably fabricated from a polyamide which has a thickness of several mils or less, and may have a thickness down to about 1 mil. If of rigid construction, the interconnect substrate 14 is preferably fabricated from a ceramic material. It is further contemplated that the interconnect substrate 14 may be fabricated in its entirety from a plastic PCB material.

Disposed on the interconnect substrate 14 is a first conductive pad array 24, a second conductive pad array 26, and a third conductive pad array 28. As seen in FIG. 3, the second and third conductive pad arrays 26, 28 extend along respective ones of the lateral peripheral edge segments 22 of the interconnect substrate 14 on opposite sides of the first conductive pad array 24 which is centrally oriented thereupon. Additionally, the second and third conductive pad arrays 26, 28 are each electrically connected to the first conductive pad array 24 in a manner which will be described in more detail below.

In the chip package 12 of the first embodiment, the first conductive pad array 24 comprises a first set of pads 30 disposed on the top surface 16 of the interconnect substrate 14. The second conductive pad array 26 comprises a second set of pads 32 disposed on the top surface 16 and a third set of pads 34 disposed on the bottom surface 18. The second and third sets of pads 32, 34 are arranged in identical patterns such that the pads 32 of the second set are aligned with respective ones of the pads 34 of the third set. Similar to the second conductive pad array 26, the third conductive pad array 28 comprises a fourth set of pads 36 disposed on the top surface 16 and a fifth set of pads 38 disposed on the bottom surface 18. The pads of the fourth and fifth sets 36, 38 are also arranged in identical patterns such that the pads 36 of the fourth set are aligned with respective ones of the pads 38 of the fifth set.

In the chip package 12, the pads 32 of the second set are electrically connected to respective ones of the pads 30 of the first set, with the pads of the fourth set 36 being electrically connected to respective ones of the pads 38 of the fifth set. Such electrical connection may be facilitated through the use of vias extending through the interconnect substrate 14 or conductive tracings which extend about the lateral peripheral edge segments 22 thereof. In the chip package 12 of the first embodiment, the second and third conductive pad arrays 26, 28 are identically configured to each other. As such, the second through fifth sets of pads 32, 34, 36, 38 are all arranged in identical patterns.

As indicated above, the second and third conductive pad arrays 26, 28 are each electrically connected to the first conductive pad array 24. More particularly, the pads of the second and third sets 32, 34 are each electrically connected to respective ones of the pads 30 of the first set through the use of conductive tracings 40. Due to the pads 36, 38 of the fourth and fifth sets being electrically connected to respective ones of the pads 32, 34 of the second and third sets, they are also electrically connected to the pads 30 of the first set by the conductive tracings 40. The pads 30, 32, 34, 36, 38 of the first through fifth sets and conductive tracings 40 are preferably fabricated from very thin copper having various thicknesses, preferably in the range of from about 5 microns to about 25 microns through the use of conventional etching techniques. Advantageously, the use of the thin copper for the pads 30, 32, 34, 36, 38 and conductive tracings 40 allows for etching line widths and spacings down to a pitch of about 4 mils which substantially increases the routing density on the interconnect substrate 14. The pads 30, 32, 34, 36, 38 and conductive tracings 40 collectively define a conductive pattern of the interconnect substrate 14.

As best seen in FIG. 3, the interconnect sub-assembly 13 of the chip package 12 of the first embodiment further comprises first and second identically configured rail members 54, 56 which each have a generally rectangular configuration and define opposed, generally planar top and bottom surfaces. Disposed on the first rail member 54 is a fourth conductive pad array 58, while disposed on the second rail member 56 is a fifth conductive pad array 60. The fourth conductive pad array 58 itself preferably comprises sixth and seventh sets of pads 62, 64 which are disposed on respective ones of the top and bottom surfaces of the first rail member 54 and arranged in identical patterns such that the pads 62 of the sixth set are aligned with respective ones of the pads 64 of the seventh set. Similarly, the fifth conductive pad array 60 preferably comprises eighth and ninth sets of pads 66, 68 which are disposed on respective ones of the top and bottom surfaces of the second rail member 56 and arranged in identical patterns such that the pads 66 of the eighth set are aligned with respective ones of the pads 68 of the ninth set.

In the interconnect sub-assembly 13 of the chip package 12, the pads 62 of the sixth set are electrically connected to respective ones of the pads 64 of the seventh set, with the pads 66 of the eighth set being electrically connected to respective ones of the pads 68 of the ninth set. Such electrical connection is preferably facilitated through the extension of vias through the first and second rail members 54, 56. As is apparent from FIGS. 3 and 3A, the pads 32, 34, 36, 38 of the second through fifth sets (which are disposed upon the interconnect substrate 14), the pads 62, 64 of the sixth and seventh sets (which are disposed upon the first rail member 54) and the pads 66, 68 of the eighth and ninth sets (which are disposed upon the second rail member 56) are arranged in identical patterns. Additionally, the pads 62, 64, 66, 68 of the sixth through ninth sets are preferably fabricated from very thin copper in the same manner as the pads 30, 32, 34, 36, 38 of the first through fifth sets as described above. However, those of ordinary skill in the art will recognize that the pads of the second through ninth sets described above need not necessarily be arranged in identical patterns.

In addition to the interconnect sub-assembly 13, the chip package 12 of the first embodiment comprises an integrated circuit chip 42 which is electrically connected to the first conductive pad array 24 of the interconnect substrate 14, and hence to the second hand third conductive pad arrays 26, 28 by virtue of their electrical connection to the first conductive pad array 24 via the conductive tracings 40. The integrated circuit chip 42 preferably comprises a flip chip device or a fine pitch BGA (ball grid array) device, and includes a rectangularly configured body 44 defining a generally planar top surface 46, a generally planar bottom surface 48, a pair of longitudinal sides 50, and a pair of lateral sides 52. Protruding from the bottom surface 48 of the body 44 are a plurality of generally semi-spherically shaped conductive contacts 49 which are preferably arranged in an identical pattern to the first set of pads 30. The electrical connection of the integrated circuit chip 42 to the first conductive pad array 24 is preferably facilitated by soldering the conductive contacts 49 of the integrated circuit chip 42 to respective ones of the pads 30 of the first set. Alternatively, such electrical connection may be facilitated through the use of an adhesive such as a conductive epoxy or a z-axis adhesive.

The integrated circuit chip 42, and in particular the body 44 thereof, is preferably sized relative to the interconnect substrate 14 such that when the conductive contacts 49 of the integrated circuit chip 42 are electrically connected (e.g., soldered or adhesively secured) to respective ones of the pads 30 of the first set, the longitudinal sides 50 of the body 44 are substantially flush with respective ones of the longitudinal peripheral edge segments 20 of the interconnect substrate 14, with the lateral sides 52 of the body 44 being disposed in spaced relation to respective ones of the lateral peripheral edge segments 22 of the interconnect substrate 14 so as not to cover any portion of the second and third conductive pad arrays 26, 28 extending therealong, and more particularly the pads 32, 36 of the second and fourth sets.

To assemble the interconnect sub-assembly 13 of chip package 12 of the first embodiment, the first and second rail members 54, 56 are attached to the interconnect substrate 14, and more particularly to the bottom surface 18 thereof. When the first and second rail members 54, 56 are properly attached to the interconnect substrate 14, either the sixth or seventh sets of pads 62, 64 of the first rail member 54 are electrically connected to respective ones of the pads 34 of the third set of the second conductive pad array 26. Similarly, either the eighth or ninth sets of pads 66, 68 of the second rail member 56 are electrically connected to respective ones of the pads 38 of the fifth set of the third conductive pad array 28. However, those of ordinary skill in the art will recognize that either the sixth or seventh sets of pads 62, 64 may be electrically connected to respective ones of the pads 38 of the fifth set, and that either the eighth or ninth sets of pads 66, 68 may be electrically connected to respective ones of the pads 34 of the third set.

The electrical connections between the first and second rail members 54, 56 and the interconnect substrate 14, and more particularly between the fourth and fifth conductive pad arrays 58, 56 and respective ones of the second and third conductive pad arrays 26, 28, may be facilitated via either a soldering process or through the use of an adhesive such as a conductive epoxy or a z-axis adhesive. As seen in FIG. 1, the first and second rail members 54, 56 are preferably sized relative to the interconnect substrate 14 such that when attached and electrically connected thereto in the aforementioned manner, the opposed ends of the first and second rail members 54, 56 are substantially flush with and do not protrude beyond the longitudinal peripheral edge segments 20 of the interconnect substrate 14. Additionally, one longitudinal side of each of the first and second rail members 54, 56 is substantially flush with a respective one of the lateral peripheral edge segments 22 of the interconnect substrate 14. The assembly of the chip package 12 of the first embodiment is completed by electrically connecting the conductive contacts 49 of the integrated circuit chip 42 to respective ones of the pads 30 of the first set comprising the first conductive pad array 24. Such electrical connection may also be facilitated through the use of either solder or an adhesive.

Figure 7:
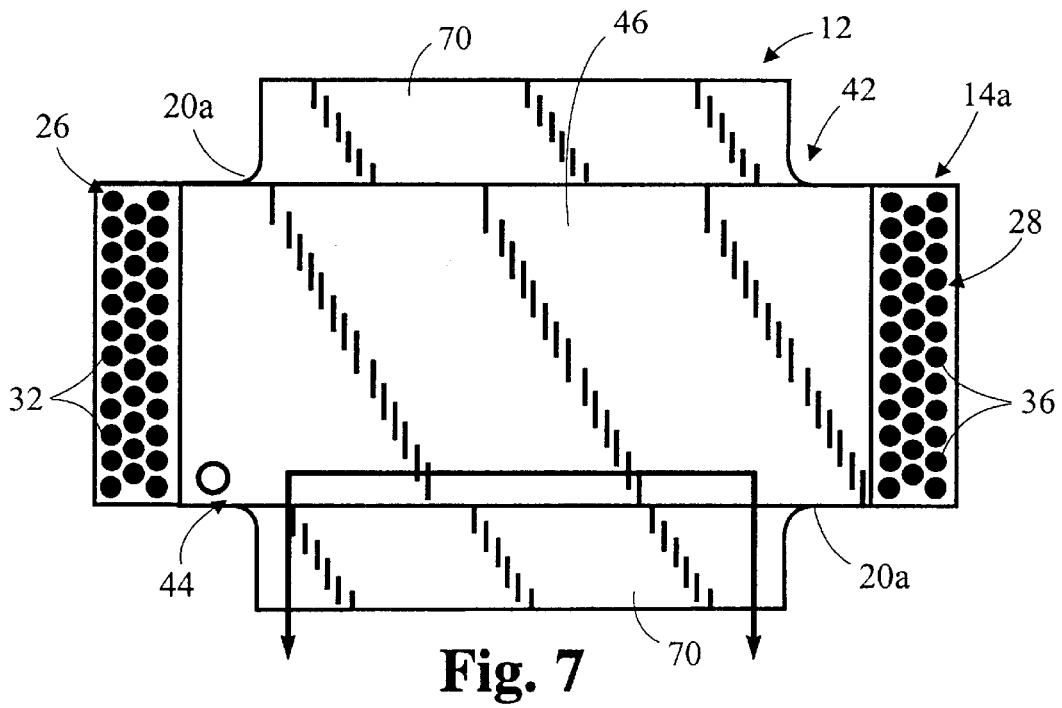
FIG. 7 is a top plan view of a modified version of the chip package constructed in accordance with the first embodiment of the present invention wherein the interconnect substrate of the interconnect sub-assembly thereof is provided with a pair of thermally conductive fin portions.
Figure 8:
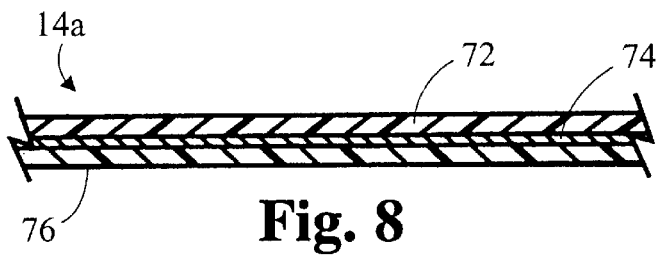
FIG. 8 is a cross-sectional view taken along 8—8 of FIG. 7.
Figure 9:
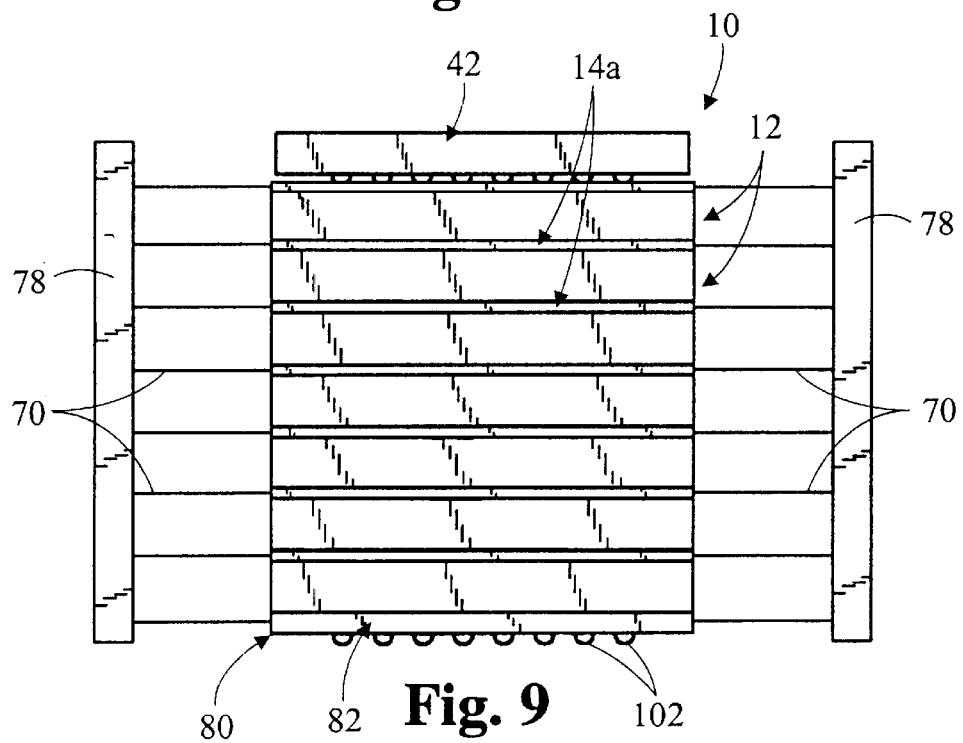
FIG. 9 is a side elevational view of a chip stack incorporating the modified versions of the chip packages shown in FIG. 7.

Referring now to FIGS. 7 and 8, the interconnect sub-assembly 13 of the chip package 12 of the first embodiment may be provided with an interconnect substrate 14a which comprises a modified version of the previously described interconnect substrate 14. More particularly, the interconnect substrate 14a includes a pair of heat dissipating fin portions 70 which protrude laterally from respective ones of the longitudinal peripheral edge segments 20a thereof. As seen in FIG. 8, the interconnect substrate 14a preferably comprises top, middle and bottom layers 72, 74, 76 disposed in laminar juxtaposition to each other, with the top and bottom layers 72, 66 preferably being fabricated from a polymer material and the middle layer 74 preferably being fabricated from a metallic material and defining the fin portions 70. As will be described in more detail below, when the interconnect substrate 14a including the fin portions 70 is included in the chip package 12, a pair of heat dissipation members. 78 (as shown in FIG. 9) may be used in conjunction with the chip package 12 and attached to respective ones of the fin portions 70 of the interconnect substrate 14a thereof. Though not shown, those of ordinary skill in the art will recognize that the interconnect substrate 14a may be formed from more than three (3) layers, with two or more of such layers being fabricated from a metallic material and defining the fin portions 70.

Figure 2:
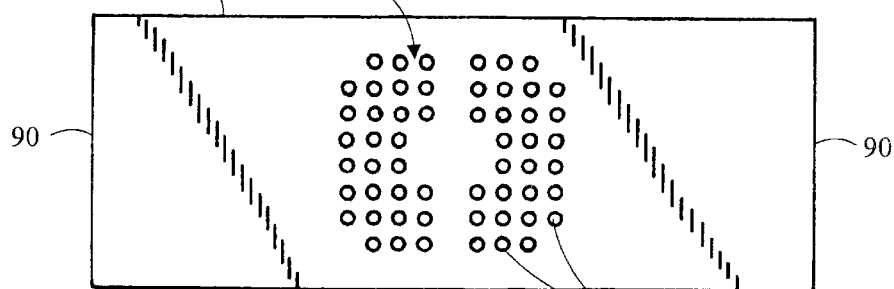
FIG. 2 is a bottom plan view of the interconnect substrate of the base package of the chip stack shown in FIG. 1.
Figure 3A:
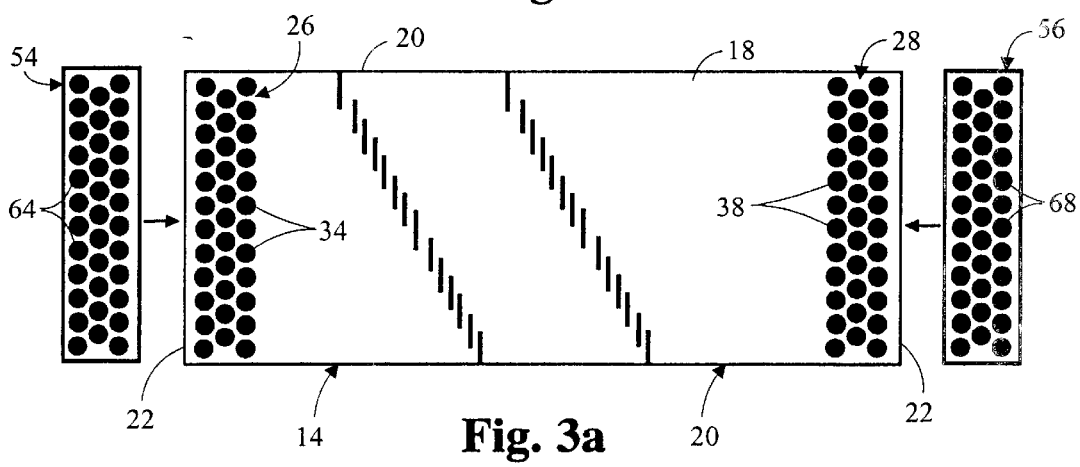
FIG. 3A is an exploded view illustrating the bottom surfaces of the interconnect substrate and first and second rail members of the interconnect sub-assembly of the chip package constructed in accordance with the first embodiment of the present invention.

Referring now to FIGS. 1–3, in addition to one or more chip packages 12, the chip stack 10 of the present invention comprises a base package 80. The base package 80 itself comprises a generally rectangular interconnect substrate 82 which defines a generally planar top surface 84 and a generally planar bottom surface 86. In addition to the top and bottom surfaces 84, 86, the interconnect substrate 82 of the base package 80 defines a pair of longitudinal peripheral edge segments 88 and a pair of lateral peripheral edge segments 90. Disposed on the top surface 84 of the interconnect substrate 82 is a sixth conductive pad array 92, while disposed on the bottom surface 86 thereof is a seventh conductive pad array 94 which is preferably identically configured to the sixth conductive pad array 92 and electrically connected thereto.

In addition to being identically configured to each other, the sixth and seventh conductive pad arrays 92, 94 are identically configured to the first conductive pad array(s) 24 of the chip package(s) 12 within the chip stack 10.

However, the sixth and seventh conductive pad arrays 92, 94 need not necessarily be identically configured to each other, or to the first conductive pad array(s) 24 of the chip package(s) 12 within the chip stack 10.

Also disposed on the top surface 84 of the interconnect substrate 82 are identically configured eighth and ninth conductive pad arrays 96, 98 which extend along respective ones of the lateral peripheral edge segments 90 and are disposed on opposite sides of the sixth conductive pad array 92. The eighth and ninth conductive pad arrays 96, 98 are each electrically connected to the sixth conductive pad array 92 in a manner which will be described in more detail below. In addition to being identically configured to each other, the eighth and ninth conductive pad arrays 96, 98 of the base package 80 are identically configured to the second, third, fourth and fifth conductive pad arrays 26, 28, 58, 60 of the chip package(s) 12 in the chip stack 10. Once again, those of ordinary skill in the art will recognize that the eight and ninth conductive pad arrays 96, 98 need not necessarily be identically configured to each other or to the second, third, fourth and fifth conductive pad arrays 26, 28, 58, 60 of the chip package(s) 12 in the chip stack 10.

In the interconnect substrate 82 of the base package 80, the sixth conductive pad array 92 comprises a tenth set of pads 100, with the seventh conductive pad array 94 comprising an eleventh set of pads 102 which are arranged in identical pattern to the tenth set of pads 100 such that the pads 100 of the tenth set are aligned with respective ones of the pads 102 of the eleventh set. In the base package 80, the pads 102 of the eleventh set each have a generally semi-spherical configuration and protrude outwardly from the bottom surface 86 of the interconnect substrate 82. Additionally, the pads 100 of the tenth set are electrically connected to respective ones of the pads 102 of the eleventh set through the use of, for example, vias which extend through the interconnect substrate 82 of the base package 80. The pads 100, 102 of the tenth and eleventh sets need not be arranged in identical patterns, though it is preferred that they be arranged in similar patterns.

In the base package 80, the eighth conductive pad array 96 comprises a twelfth set of pads 104, with the ninth conductive pad array 98 comprising a thirteenth set of pads 106. Due to the eighth and ninth conductive pad arrays 96, .98 preferably being identically configured to the second through fifth conductive pad arrays 26, 28, 58, 60 of the chip package(s) 12 in the chip stack 10, the twelfth and thirteenth sets of pads 104, 106 are arranged in identical patterns to the second through ninth sets of pads 32, 34, 36, 38, 62, 64, 66, 68. As indicated above, the eighth and ninth conductive pad arrays 96, 98 are each electrically connected to the sixth conductive pad array 92. More particularly, as best seen in FIG. 3, the pads 104, 106 of the twelfth and thirteenth sets are electrically connected to respective ones of the pads 100 of the tenth set through the use of conductive tracings 108.

In the base package 80, the pads 100, 104, 106 of the tenth, twelfth and thirteenth sets and conductive tracings 108 are fabricated from very thin copper in the same manner previously described in relation to the pads and conductive tracings of the interconnect substrate 14 of the chip package 12. Additionally, the interconnect substrate 82 of the base package 80 is preferably fabricated to have the same length and width dimensions as the interconnect substrate 14, and may also be of either flexible or rigid construction and formed from the same material used to form the interconnect substrate 14. However, as best seen in FIG. 1, it is preferred that the thickness of the interconnect substrate 82 in the base package 80 exceed the thickness of the interconnect substrate 14 of the chip package 12. Such increased thickness allows the interconnect substrate 82 to provide greater support to the chip package(s) 12 stacked thereupon.

In addition to the interconnect substrate 82, the base package 80 of the chip stack 10 comprises an integrated circuit chip 110 which is electrically connected to the sixth conductive pad array 92. The integrated circuit chip 110 of the base package 80 is identically configured to the integrated circuit chip(s) 42 of the chip package(s) 12 in the chip stack 10, with the electrical connection to the interconnect substrate 82 preferably being facilitated by soldering or adhesively securing the conductive contacts of the integrated circuit chip 110 to respective ones of the pads 100 of the tenth set.

To facilitate the assembly of the chip stack 10 shown in FIG. 1, the fourth and fifth conductive pad arrays 58, 60 of the first and second rail members 54, 56 of the interconnect sub-assembly 13 of the chip package 12 are electrically connected to respective ones of the eighth and ninth conductive pad arrays 96, 98 of the base package 80. More particularly, those pads 62, 64, 66, 68 of the fifth through ninth sets in the chip package 12 which are not electrically connected to the interconnect substrate 14 thereof are electrically connected to respective ones of the pads 104, 106 of the twelfth and thirteenth sets which, as indicated above, are disposed on the top surface 84 of the interconnect substrate 82 of the base package 80. Such electrical connection may be facilitated through the use of solder or an adhesive such as a conductive epoxy or a z-axis adhesive.

Figure 4:
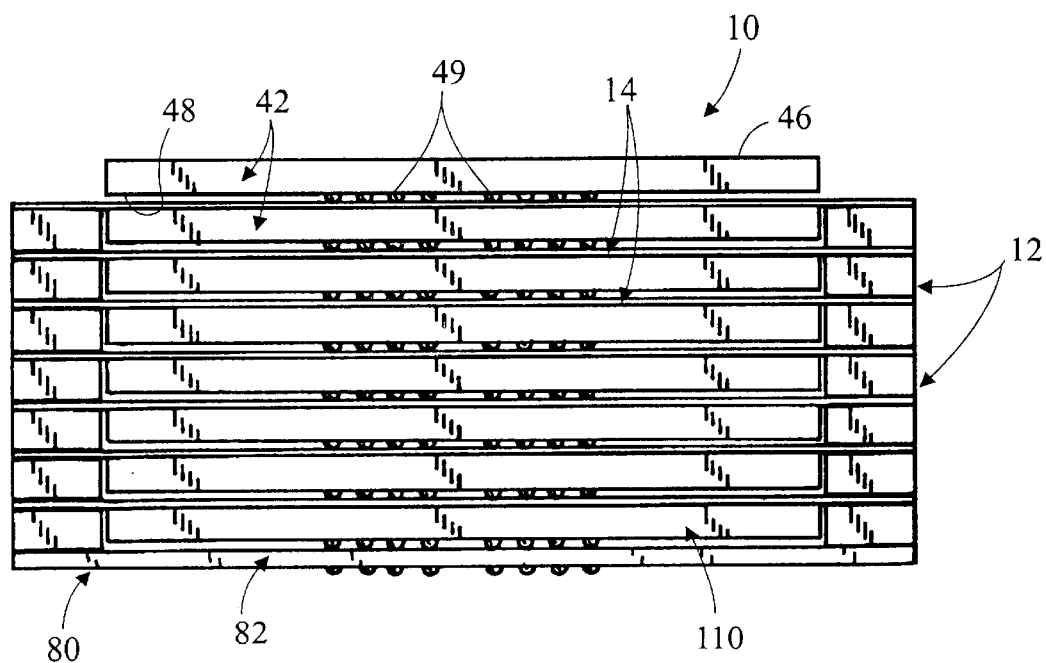
FIG. 4 is a side-elevational view of a chip stack including a base package and seven chip packages which are each constructed in accordance with the first embodiment of the present invention.

As seen in FIG. 4, the chip stack 10, rather than being provided with a single chip package 12 as shown in FIG. 1, may be provided with multiple chip packages 12 stacked upon a single base package 80. In the chip stack 10 shown in FIG. 4, seven (7) chip packages 12 are stacked upon the base package 80. As will be recognized, when the chip stack 10 includes multiple chip packages 12, the fourth and fifth conductive pad arrays 58, 60 of the first and second rail members 54, 56 of the interconnect sub-assembly 13 of the lowermost chip package 12 in the chip stack 10 are electrically connected to respective ones of the eighth and ninth conductive pad arrays 96, 98 of the base package 80 in the above-described manner. The remaining chip packages 12 are assembled in the chip stack 10 such that the fourth and fifth conductive pad arrays 58, 60 of the first and second rail members 54, 56 of the interconnect sub-assembly 13 of each chip package 12 are electrically connected to respective ones of the second and third conductive pad arrays 26, 28 of the interconnect substrate 14 of the interconnect sub-assembly 13 of the chip package 12 immediately therebelow. More particularly, those pads 62, 64, 66, 68 of the sixth through ninth sets of each chip package :12 which are not electrically connected to the interconnect substrate 14 thereof are electrically connected to respective ones of the pads 32, 36 of the second and fourth sets which are disposed on the top surface of the interconnect substrate 14 of the chip package 12 immediately therebelow.

As seen in FIG. 9, it is further contemplated that the chip stack 10 may be assembled to include multiple chip packages 12 which each have the modified interconnect substrate 14a defining the heat dissipating fin portions 70. In this particular chip stack 10, it is further contemplated that the previously described heat dissipation members 78 will be attached to respective ones of each of the two aligned sets of fin portions 70. As is further seen in FIG. 9, the base package 80 of this particular chip stack 10 may also be provided with a modified interconnect substrate which includes heat dissipating fin portions.

Figure 5:
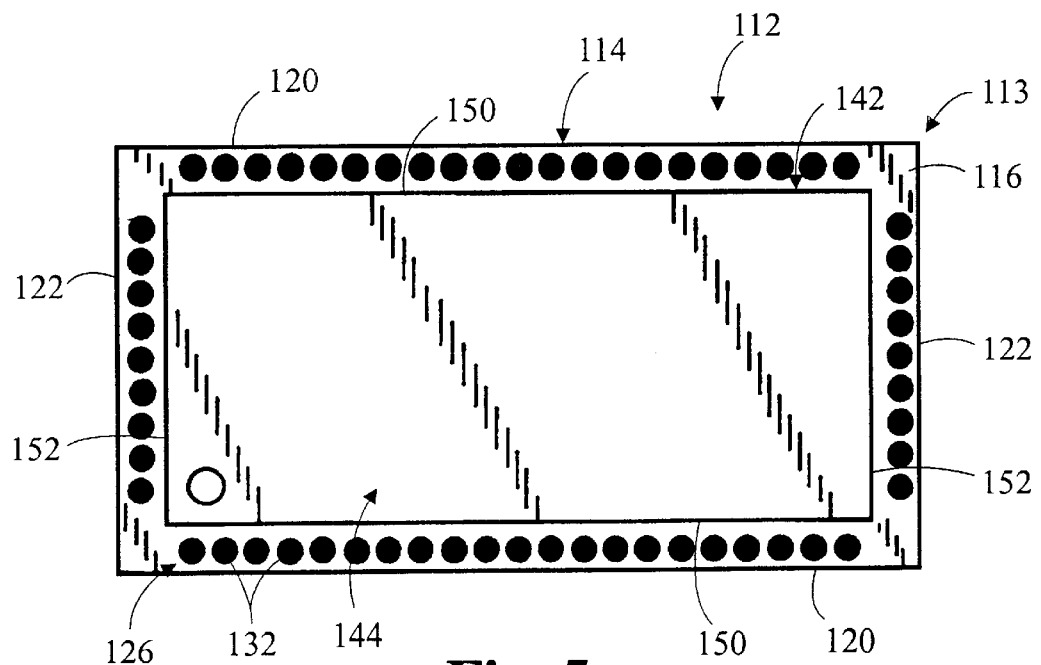
FIG. 5 is a top plan view of a chip package constructed in accordance with a second embodiment of the present invention.

Referring now to FIG. 5, there is depicted a stackable integrated circuit chip package 112 constructed in accordance with a second embodiment of the present invention. The chip package 112 includes an interconnect sub-assembly 113 comprising an interconnect substrate 114 which has a generally rectangular configuration and defines a generally planar top surface 116 and a generally planar bottom surface. The interconnect substrate 114 further defines a pair of longitudinal peripheral edge segments 120 and a pair of lateral peripheral edge segments 122. Similar to the interconnect substrate 14 of the chip package 12 of the first embodiment, the interconnect substrate 114 of the chip package 112 may be of either flexible or rigid construction. If flexible, the interconnect substrate 114 may be fabricated from various materials, one such material candidate being polyamide. If of rigid construction, the interconnect substrate 114 is preferably fabricated from a ceramic or polymer/plastic material.

Disposed on the interconnect substrate 114 is a first conductive pad array and a second conductive pad array 126. The second conductive pad array 126 extends along the longitudinal and lateral peripheral edge segments 120, 122 of the interconnect substrate 114. The second conductive pad array 126 is also electrically connected to the first conductive pad array, with such electrical connection preferably being facilitated by conductive tracings which are formed in accordance with conventional etching techniques. The first conductive pad array preferably comprises a first set of pads disposed on the top surface 116 of the interconnect substrate 114, with the second conductive pad array 126 comprising a second set of pads 132 disposed on the top surface 116 and a third set of pads disposed on the bottom surface of the interconnect substrate 114 and preferably arranged in an identical pattern such that the pads 132 of the second set are aligned with respective ones of the pads of the third set. The pads 132 of the second set are also electrically connected to respective ones of the pads of the third set either through the use of vias extending through the interconnect substrate 114 or conductive tracings which extend about the longitudinal and lateral peripheral edge segments 120, 122 thereof.

The interconnect sub-assembly 113 of the chip package 112 of the second embodiment further comprises first and second identically configured rail members which are attached to the interconnect substrate 114. The first rail member has a third conductive pad array disposed thereon, with the second rail member having a fourth conductive pad array disposed thereon. The third and fourth conductive pad arrays of the first and second rail members are each electrically connected to the second conductive pad array 126, and hence the first conductive pad array and integrated circuit chip 142.

In addition to the interconnect sub-assembly 113, the chip package 112 of the second embodiment includes an integrated circuit chip 142 which is electrically connected to the first conductive pad array. The integrated circuit chip 142 is identically configured to the integrated circuit chip 42 previously described in relation to the first embodiment, with the semi-spherically shaped conductive contacts thereof being arranged on the bottom surface of the body 144 in an identical pattern to the first set of pads comprising the first conductive pad array. In this respect, the electrical connection of the integrated circuit chip 142 to the first conductive pad array of the interconnect substrate 114 may be facilitated by soldering or adhesively securing the conductive contacts to respective ones of the pads of the first set.

In the second embodiment, the integrated circuit chip 142 is sized relative to the interconnect substrate 114 of the interconnect sub-assembly 113 such that the longitudinal sides 150 of the body 144 are disposed in spaced relation to respective ones of the longitudinal peripheral edge segments 120 of the interconnect substrate 114. Additionally, the lateral sides 152 of the body 144 are disposed in spaced relation to respective ones of the lateral peripheral edge segments 122 of the interconnect substrate 114 such that the body 144 of the integrated circuit chip 142 does not cover any portion of the second conductive pad array 126, and in particular the pads 132 of the second set which extend about the body 144 in the manner shown in FIG. 5.

As explained above, the chip package 12 of the first embodiment is formed by attaching the integrated circuit chip 42 to the interconnect sub-assembly 13. Those of ordinary skill in the art will recognize that the chip stack 12 of the first embodiment may be constructed without the first and second rail members 54, 56 being pre-attached or assembled to the interconnect substrate 14 to form the interconnect sub-assembly 13. In this respect, the process of forming the chip stack 12 may include the separate process of attaching the first and second rail members 54, 56 to the interconnect substrate 14 such that the fourth and fifth conductive pad arrays 58, 60 are electrically connected to respective ones of the second and third conductive pad arrays 26, 28 in the above-described manner. Similarly, the formation of the chip stack 112 of the second embodiment may include the separate process of attaching the first and second rail members to the interconnect substrate 114 in the above-described manner, as opposed to the same being pre-attached in the form of the interconnect sub-assembly 113.

Figure 6:
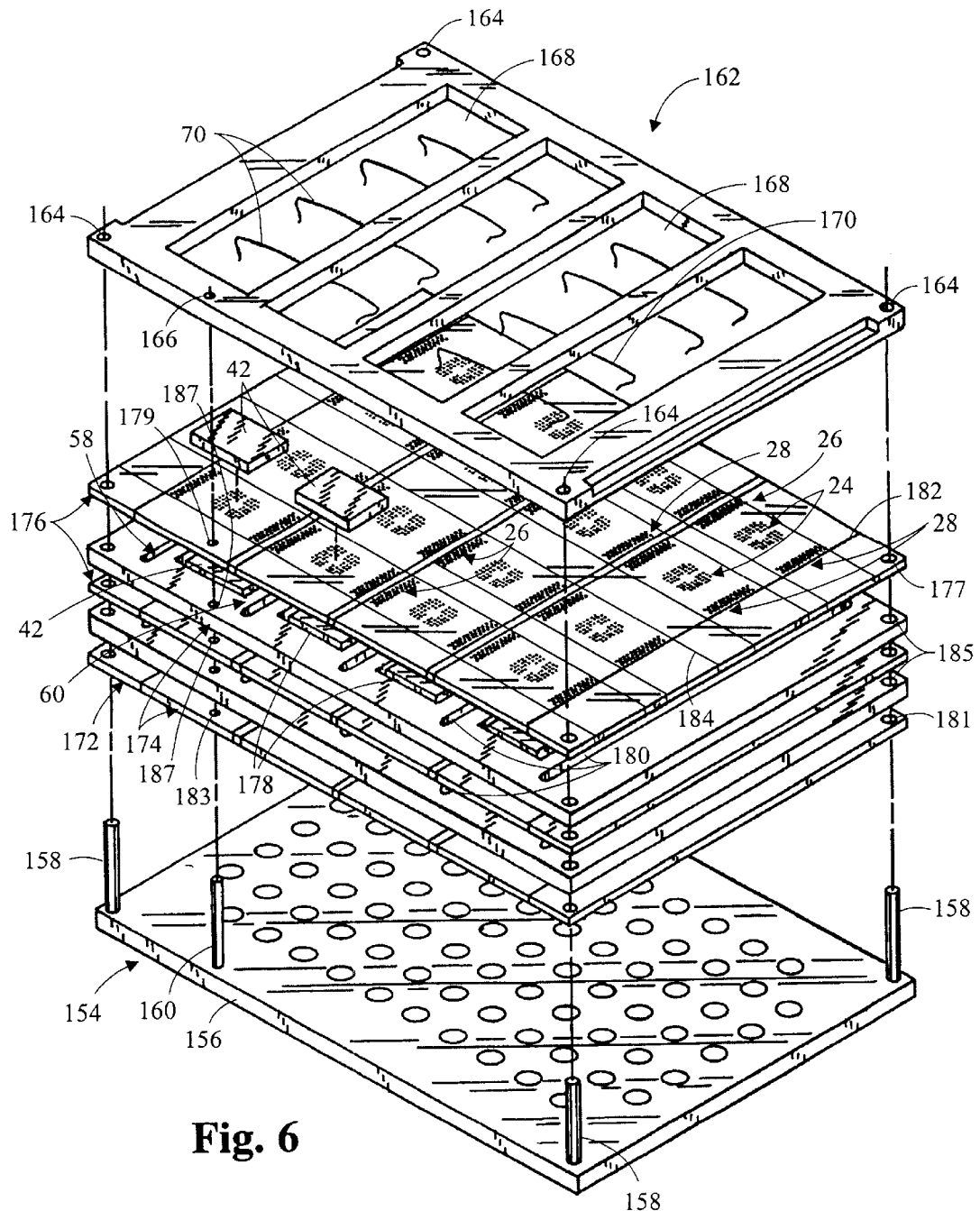
FIG. 6 is an exploded view illustrating a preferred manner of assembling a chip stack including a base package and multiple chip packages which are each constructed in accordance with the first embodiment of the present invention.

Referring now to FIG. 6, there is depicted a tooling jig 154 which is used to facilitate the concurrent assembly of multiple chip stacks 10. The tooling jig 154 comprises a rectangularly configured base 156 having four pins 158 extending perpendicularly upward from the top surface thereof. The pins 158 are located at respective ones of the four corner regions defined by the base 156. In addition to the pins 158, extending perpendicularly upward from the top surface of the base 156 adjacent one of the longitudinal sides thereof is a pin 160 which has a diameter slightly smaller than that of the pins 158. In addition to the base 156, the tooling jig 154 comprises a top member 162 which also has a generally rectangular configuration and includes four apertures 164 disposed in respective ones of the four corner regions defined thereby. In the top member 162, the apertures 164 are sized to slidably receive respective ones of the pins 158. Also disposed in the top member 162 is an aperture 166 which is located adjacent one of the longitudinal sides thereof and is sized to slidably receive the pin 160. In addition to the apertures 164, 166, disposed within the top member 162 are four rectangularly configured openings 168 which extend in spaced, generally parallel relation to each other and to the lateral sides of the top member 162. Extending laterally into each of the openings 168 are four identically configured biasing members 170 of the top member 162, the use of which will be described in more detail below.

The concurrent assembly/fabrication of the chip stacks 10 of the present invention is accomplished through the use of one base panel 172, one or more package panels 174, one or more substrate sheets 176, and multiple integrated circuit chips 42. The base panel 172, package panel(s) 174 and substrate sheet(s) 176 are each rectangularly configured and have length and width dimensions which are substantially equal to those of the base 156 and top member 162 of the tooling jig 154. As seen in FIG. 6, each of the substrate sheets 176 includes multiple sets of the first, second and third conductive pad arrays 24, 26, 28 disposed on the top and bottom surfaces thereof. The sets of first, second and third conductive pad arrays 24, 26, 28 are preferably arranged on each of the substrate sheets 176 in four parallel rows, with each row including four sets for a total of sixteen sets on each substrate sheet 176. Disposed in respective ones of the four corner regions defined by each substrate sheet 176 are four apertures 177 which are sized to receive respective ones of the pins 158. Also disposed in each substrate sheet 176 adjacent one of the longitudinal sides thereof is an aperture 179 which is sized to receive the pin 160.

The base panel 172 is similar to the substrate sheet(s) 176 and includes a total of sixteen sets of the sixth, seventh, eighth and ninth conductive pad arrays 92, 94, 96, 98 which are arranged thereon so as to be alignable with respective ones of the sets of first, second and third conductive pad arrays 24, 26, 28 of the substrate sheet(s) 176. Disposed within respective ones of the four corner regions defined by the base panel 172 are four apertures 181 which are sized to receive respective ones of the pins 158. Also disposed in the base panel 172 adjacent one of the longitudinal sides thereof is an aperture 183 which is sized to receive the pin 160.

The package panel(s) 174, like the substrate sheet(s) 176 and base panel 172, each include four apertures 185 which are disposed in respective ones of the four corner regions defined thereby and are sized to receive respective ones of the pins 158. Each package panel 174 also includes an aperture 187 disposed therein adjacent one of the longitudinal sides thereof which is sized to receive the pin 160. Also disposed in each package panel 174 is a total of sixteen rectangularly configured openings 178 which are arranged in four generally parallel rows of four openings 178 each. Disposed on the top and bottom surfaces of each package panel 174 along respective ones of the lateral sides of each of the openings 178 therein are the fourth and fifth conductive pad arrays 58, 60. The fourth and fifth conductive pad arrays 58, 60 extend between the openings 178 and respective ones of five slots 180 which extend in spaced, parallel relation to each other and to the lateral sides of the package panel 174. Each of the slots 180 terminates slightly inwardly from the longitudinal sides of the package panel 174.

In a preferred assembly process, the base panel 172 is mounted to the base 156 of the tooling jig 154, with such mounting being facilitated by the advancement of the pins 158, 160 through respective ones of the apertures 181, 183. The base panel 172 is preferably oriented such that the bottom surface thereof is in direct contact with the top surface of the base 156, and the top surface of the base panel 172 including the sixth, eighth and ninth conductive pad arrays 92, 96, 98 thereon is exposed. Thereafter, a package panel 174 is mounted to the base 156 in the same manner, i.e., through the advancement of the pins 158, 160 through respective ones of the apertures 185, 187. Importantly, when the package panel 174 is mounted to the base 156, each set of the fourth and fifth conductive pad arrays 58, 60 thereon is in aligned contact with a respective set of the eighth and ninth conductive pad arrays 96, 98 of the base panel 172. A plurality of integrated circuit chips 42 are then inserted into respective ones of the openings 178 of the base panel 172 such that the conductive contacts 49 thereof are in aligned contact with respective ones of the sixth conductive pad arrays 92 of the base panel 172.

Subsequent to the integrated circuit chips 42 being inserted into the openings 178, a substrate sheet 176 is mounted to the base 156 via the advancement of the pins 158, 160 into respective ones of the apertures 177, 179. When the substrate sheet 176 is properly mounted to the base 156, each set of the second and third conductive pad arrays 26, 28 thereon is in aligned contact with a respective set of the fourth and fifth conductive pad arrays 58, 60 of the package panel 174, with the integrated circuit chips 42 previously inserted into the openings 178 being covered by the substrate sheet 176. As will be recognized, the first conductive pad arrays 24 and second and fourth sets of pads 32, 36 of the second and third conductive pad arrays 26, 28 are exposed as being disposed on the top surface of the substrate sheet 176. Thereafter, additional integrated circuit chips 42 are positioned upon the top surface of the substrate sheet 176 such that the conductive contacts 49 of the integrated circuit chips 42 are in aligned contact with respective ones of the first conductive pad arrays 24.

Finally, the top member 162 of the tooling jig 154 is mounted to the base 156 thereof via the advancement of the pins 158, 160 into respective ones of the apertures 164, 166. The mounting of the top member 162 to the base 158 facilitates the complete formation of a stack assembly. In the stack assembly, the base and package panel(s) 172, 174, substrate sheet(s) 176 and integrated circuit chips 42 define a panel/sheet sub-assembly thereof. In forming the stack assembly, the proper orientations of the various components thereof relative to each other is ensured by the advancement of the pin 160 through the coaxially aligned apertures 166, 179, 183, 187. The entire stack assembly may be held together via clips attached to the longitudinal and/or lateral sides thereof. The integrated circuit chips 142 positioned upon the top surface of the substrate sheet 176 are maintained in their prescribed locations thereupon via respective ones of the biasing members 170 of the top member 162 which apply a downwardly directed biasing force thereto.

It is contemplated that some or all of the conductive contacts and/or conductive pads of the integrated circuit chips 42, base and package panel(s) 172, 174 and/or substrate sheet(s) 176 of the panel/sheet sub-assembly may have solder or an adhesive pre-applied thereto such that the application of heat to the assembled stack assembly (e.g., the placement thereof into an oven) will facilitate the rigid mounting/electrical connection between the panel/sheet sub-assembly components to each other in a desired manner. Additionally, those of ordinary skill in the art will recognize that the above-described stacking process may be repeated with additional integrated circuit chips 42, package panels 174 and substrate sheets 176 depending on the desired size/height of the chip stack 10. As previously explained, as an alternative to the use of solder, the rigid mounting/electrical connection between the components of the panel/sheet sub-assembly may be facilitated through the use of a conductive epoxy.

After the various components of the panel/sheet sub-assembly have been bonded/electrically connected to each other, it is contemplated that the panel/sheet sub-assembly will be separated from the tooling jig 154 and subjected to a cutting operation wherein individual chip stacks 10 are formed therefrom. In this respect, cutting the panel/sheet sub-assembly laterally along each of the slots 180 and longitudinally along the lateral ends of the second and third conductive pad arrays 26, 28 facilitates the formation of sixteen chip stacks 10. To assist in the cutting or "singulation" process, each substrate sheet 176 is provided with a series of cutting lines 182 which extend laterally thereacross in spaced, generally parallel relation to each other, and a series of cutting lines 184 which extend longitudinally thereacross in spaced, generally parallel relation to each other. When the various components of the panel/sheet sub-assembly are properly stacked upon each other in the above-described manner, the cutting lines 182 are substantially aligned with respective ones of the slots 180. The cutting lines 184 extend longitudinally along the lateral ends of the second and third conductive pad arrays 26, 28. Thus, cutting the panel/sheet sub-assembly along the cutting lines 182, 184 exposed upon the uppermost substrate sheet 176 facilitates the proper formation of the various chip stacks 10. It will be recognized that the interconnect substrate(s) 14 of the chip package(s) 12 included in each chip stack 10 are defined by the substrate sheet(s) 176, with the first and second rail members 54, 56 of the chip package(s) 12 being defined by the package panel(s) 174. The interconnect substrate 82 of the base package 80 of each chip stack 10 is defined by the base panel 172.

It is contemplated that, in accordance with the present invention, the assembly process may be accomplished with one or more panel assemblies 186 (shown in FIG. 11), each of which is formed by the pre-attachment of a substrate sheet 176 to a package panel 174. In this respect, the package panel and substrate sheet 174, 176 of each panel assembly 186 are attached to each other such that the second and third conductive pad arrays 26, 28 of the substrate sheet 176 are in aligned contact with a respective set of the fourth and fifth conductive pad arrays 58, 60 of the package panel 174. Additionally, when the package panel 174 and substrate sheet 176 are properly attached to each other, the apertures 177 will be coaxially aligned with respective ones of the apertures 185.

Figure 10:
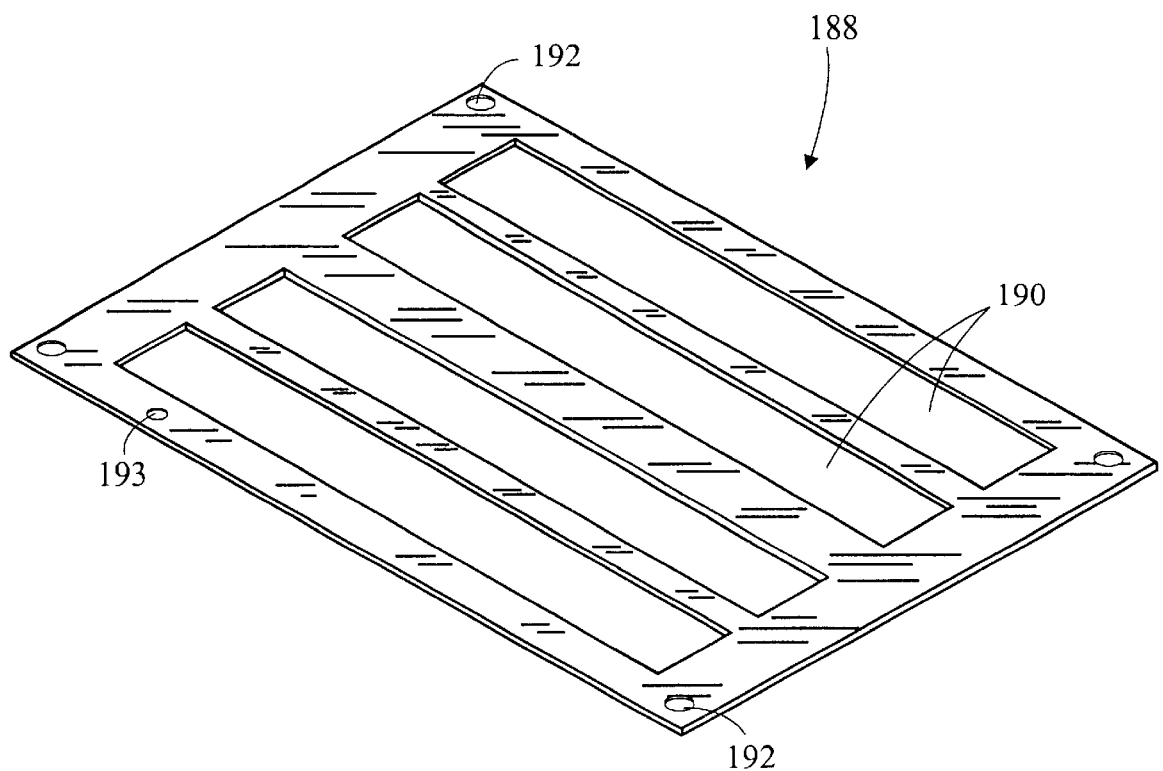
FIG. 10 is a top perspective view of a shim sheet which may be used in relation to the assembly of a chip stack of the present invention.
Figure 11:
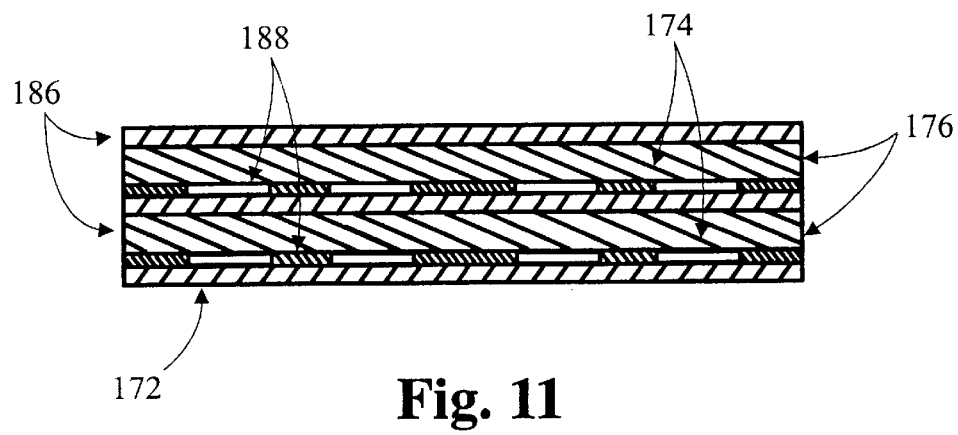
FIG. 11 is a cross-sectional view illustrating the manner in which multiple shim sheets as shown in FIG. 10 are used in the assembly of a chip stack.

As seen in FIGS. 10 and 11, when used in the assembly process, the panel assemblies 186 are not stacked into direct contact with each other, but rather are spaced from each other and from the base panel 172 through the use of multiple shim sheets 188, one of which is shown in FIG. 10. Each of the shim sheets 188 has a generally rectangular configuration, and defines opposed, generally planar surfaces. The length and width dimensions of the shim sheet 188 are substantially identical to those of the panel assemblies 186, and more particularly the package panels 174 and substrate sheets 176 thereof. Additionally, each shim sheet 188 is preferably formed to have a thickness in the range of from about 0.005 to about 0.010 inches. Disposed within the shim sheet 188 are four (4) elongate openings 190 which extend longitudinally therealong in spaced, generally parallel relation to each other. Additionally, disposed within respective ones of the four (4) corner regions of the shim sheet 188 are four (4) apertures 192.

In the alternative assembly process, the base panel 172 is mounted to the base 156 of the tooling jig 154 in the above-described manner. Thereafter, a plurality of integrated circuit chips 42 are positioned upon the base panel 172 such that the conductive contacts 49 thereof are in aligned contact with respective ones of the sixth conductive pad arrays 92 of the base panel 172. A shim sheet 188 is then mounted to the base 156 through the advancement of the pins 158, 160 through respective ones of the apertures 192, 193. Importantly, when the shim sheet 188 is mounted to the base 156, the integrated circuit chips 142 and eighth and ninth conductive pad arrays 96, 98 reside within respective ones of the openings 190, and thus are not covered by the shim sheet 188. A panel assembly 186 is then mounted to the base 156 by advancing the pins 158, 160 into respective sets of the coaxially aligned apertures 177, 185 and 179, 187. The mounting of the panel assembly 186 to the base 156 facilitates the receipt of the previously placed integrated circuit chips 42 into respective ones of the openings 178 within the package panel 174 of the panel assembly 186.

Subsequent to the panel assembly 186 being mounted to the base 156, another shim sheet 188 is mounted thereto in the above-described manner. This shim sheet 188 is placed into abutting contact with the substrate sheet 176 of the previously stacked panel assembly 186. Due to the orientation of the openings 190 therein, when the subsequently stacked shim sheet 188 is brought into abutting contact with the substrate sheet 176 of the previously stacked panel assembly 186, the first, second and third conductive pad arrays 24, 26, 28 of the substrate sheet 176 reside within respective ones of the openings 190, and thus are not covered by the shim sheet 188. Thereafter, a plurality of integrated circuit chips 42 are positioned upon the substrate sheet 176 of the panel assembly 186 so as to be placed into aligned contact with respective ones of the first conductive pad arrays 24. The process of stacking one or more panel assemblies 186 upon the base 156 may then be repeated depending upon the desired size/height of the chip stack. The formation of the panel/sheet sub-assembly in this alternative method will be completed when integrated circuit chips 42 are positioned upon respective ones of the first conductive pad arrays 24 of the substrate sheet 176 of the uppermost panel assembly 186. The mounting of the top member 162 to the base 156 in the above-described manner facilitates the complete formation of a stack assembly which, as described above, may be held together via clips attached to the longitudinal and/or lateral sides thereof.

It is contemplated that each panel assembly 186 may include a shim sheet 188 pre-attached thereto, and more particularly to the package panel 174 thereof. As will be recognized, if included in the panel assembly 186, the shim sheet 188 would be attached to the face of the package panel 174 opposite that having the substrate sheet 176 attached thereto. Additionally, the shim sheet 188 would be attached to the package panel 174 such that the third and fifth sets of pads 34, 38 and openings 178 of the package panel 174 are aligned with respective ones of the openings 190 of the shim sheet 188.

In the assembly process including this alternative panel assembly 186, the base panel 172 would initially be mounted to the base 156 of the tooling jig 154 in the above-described manner. Thereafter, a plurality of integrated circuits chips 42 are positioned upon the base panel 172 such that the conductive contacts 49 thereof are in aligned contact with respective ones of the sixth conductive pad arrays 92 of the base panel 172. A panel assembly 186 (including the shim 188) is then mounted to the base 156 by advancing the pins 158, 160 into respective sets of the coaxially aligned apertures 177, 185, 192 and 179, 187, 193. The panel assembly 186 is oriented such that the shim sheet 188 thereof will be in direct contact with the base panel 172. The mounting of the panel assembly 186 to the base 156 facilitates the receipt of the previously placed integrated circuit chips 42 into respective ones of the openings 178 within the package panel 174 of the panel assembly 186.

Subsequent to a first panel assembly 186 being mounted to the base 156, a plurality of integrated circuit chips 42 are positioned upon the substrate sheet 176 of the panel assembly 186 so as to be placed into aligned contact with respective ones of the first conductive pad arrays 24. The process of stacking one or more additional panel assemblies 186 upon the base 156 may then be repeated depending on the desired size/height of the chip stack. For each subsequently stacked panel assembly 186, the shim sheet 188 thereof is brought into direct contact with the substrate sheet 176 of the previously stacked panel assembly 186. The formation of the panel/sheet sub-assembly is completed when integrated circuit chips 42 are positioned upon respective ones of the first conductive pad arrays 24 of the substrate sheet 176 of the uppermost panel assembly 186. The mounting of the top member 162 to the base 156 in the above-described manner facilitates the complete formation of the stack assembly which, as described above, may be held together via clips attached to the longitudinal and/or lateral side thereof.

Those of ordinary skill in the art will recognize that alternative stacking methods may be employed for use in conjunction with the panel assemblies 186. For example, the stacking process may be accomplished in a manner wherein the integrated circuit chips 42 are inserted into respective ones of the openings 178 of the package panel 174 of each panel assembly 186 prior to the placement of a subsequently stacked shim sheet 188 into direct contact therewith, as opposed to the package panel 174 of a panel assembly 186 being lowered over previously placed integrated circuit chips 42. Importantly, the separation between the panel assemblies 186 and between the lowermost panel assembly 186 and base panel 172 facilitated by the shim sheets 188 creates a slight gap which allows solder or adhesive to readily flow between respective conductive contacts and pads to achieve proper electrical connections therebetween. Advantageously, due to the configuration of each of the shim sheets 188, the above-described singulation process facilitates the complete removal thereof from each of the individually formed chip stacks.

Additional modifications and improvements of the present invention may also be apparent to those of ordinary skill in the art. Thus, the particular combination of parts and steps described and illustrated herein is intended to represent only certain embodiments of the present invention, and is not intended to serve as limitations of alternative devices or methods within the spirit and scope of the invention.

What is claimed is:

1. A stackable integrated circuit chip package, comprising:
    an interconnect sub-assembly comprising:
        an interconnect substrate having first, second and third conductive pad arrays disposed thereon, the second and third conductive pad arrays being electrically connected to the first conductive pad array;
        a first rail member attached to the interconnect substrate and having a fourth conductive pad array disposed thereon; and
        a second rail member attached to the interconnect substrate and having a fifth conductive pad array disposed thereon;
        the fourth and fifth conductive pad arrays being electrically connected to respective ones of the second and third conductive pad arrays;
    an integrated circuit chip electrically connected to the first conductive pad array.

2. The chip package of claim 1 wherein the second through fifth conductive pad arrays are identically configured to each other.

3. The chip package of claim 1 wherein:
    the interconnect substrate defines opposed, generally planar top and bottom surfaces;
    the first conductive pad array comprises a first set of pads disposed on the top surface;
    the second conductive pad array comprises second and third sets of pads disposed on respective ones of the top and bottom surfaces and arranged in identical patterns such that the pads of the second set are aligned with respective ones of the pads of the third set; and
    the third conductive pad array comprises fourth and fifth sets of pads disposed on respective ones of the top and bottom surfaces and arranged in identical patterns such that the pads of the fourth set are aligned with respective ones of the pads of the fifth set;
    the pads of the second set being electrically connected to respective ones of the pads of the third set, with the pads of the fourth set being electrically connected to respective ones of the pads of the fifth set.

4. The chip package of claim 3 wherein the integrated circuit chip comprises:
    a body having opposed, generally planar top and bottom surfaces; and
    a plurality of conductive contacts protruding from the bottom surface of the body;
    the conductive contacts of the integrated circuit chip being electrically connected to respective ones of the pads of the first set.

5. The chip package of claim 4 wherein:
    the interconnect substrate has a generally rectangular configuration defining a pair of longitudinal peripheral edge segments and a pair of lateral peripheral edge segments; and
    the second and third conductive pad arrays extend along respective ones of the lateral peripheral edge segments and are disposed on opposite sides of the first conductive pad array.

6. The chip package of claim 5 wherein:
    the body of the integrated circuit chip has a generally rectangular configuration defining a pair of longitudinal sides and a pair of lateral sides; and
    the integrated circuit chip is sized relative to the interconnect substrate such that the longitudinal sides of the body are substantially flush with respective ones of the longitudinal peripheral edge segments of the interconnect substrate, and the lateral sides of the body are disposed in spaced relation to respective ones of the lateral peripheral edge segments of the interconnect substrate so as not to cover any portion of the second and third conductive pad arrays extending therealong.

7. The chip package of claim 5 wherein the interconnect substrate includes a pair of heat dissipating fin portions protruding laterally from respective ones of the longitudinal peripheral edge segments thereof.

8. The chip package of claim 7 wherein the interconnect substrate comprises top, middle and bottom layers disposed in laminar juxtaposition to each other, the top and bottom layers being fabricated from a polymer material and the middle layer being fabricated from a metallic material and defining the fin portions.

9. The chip package of claim 8 further comprising a pair of heat dissipation members attached to respective ones of the fin portions of the interconnect substrate.

10. The chip package of claim 4 wherein the conductive contacts are arranged on the bottom surface of the body in an identical pattern to the first set of pads.

11. The chip package of claim 4 wherein each of the conductive contacts has a generally semi-spherical configuration.

12. The chip package of claim 11 wherein the integrated circuit chip is selected from the group consisting of:
    a flip chip device; and
    a fine pitch BGA device.

13. The chip package of claim 3 wherein:
    the first and second rail members each define opposed, generally planar top and bottom surfaces;
    the fourth conductive pad array comprises sixth and seventh sets of pads which are disposed on respective ones of the top and bottom surfaces of the first rail member and arranged in identical patterns such that the pads of the sixth set are aligned with respective ones of the pads of the seventh set; and
    the fifth conductive pad array comprises eighth and ninth sets of pads which are disposed on respective ones of the top and bottom surfaces of the second rail member and arranged in identical patterns such that the pads of the eighth set are aligned with respective ones of the pads of the ninth set;
    the pads of the sixth set being electrically connected to respective ones of the pads of the seventh set, with the pads of the eighth set being electrically connected to respective ones of the pads of the ninth set.

14. The chip package of claim 13 wherein the pads of the second through ninth sets are arranged in identical patterns.

15. The chip package of claim 1 wherein the interconnect substrate is flexible.

16. The chip package of claim 15 wherein the interconnect substrate is fabricated from a polyamide.

17. The chip package of claim 1 wherein the interconnect substrate is fabricated from a ceramic material.

18. A chip stack comprising:
    at least two stackable integrated circuit chip packages, each of the chip packages comprising:
        an interconnect sub-assembly comprising:
            an interconnect substrate having first, second and third conductive pad arrays disposed thereon, the second and third conductive pad arrays being electrically connected to the first conductive pad array;

a first rail member attached to the interconnect substrate and having a fourth conductive pad array disposed thereon; and a second rail member attached to the interconnect substrate and having a fifth conductive pad array disposed thereon, the fourth and fifth conductive pad arrays being electrically connected to respective ones of the second and third conductive pad arrays;

an integrated circuit chip electrically connected to the first conductive pad array;

the chip packages being assembled in the chip stack such that the fourth and fifth conductive pad arrays of the first and second rail members of the interconnect sub-assembly of one of the chip packages within the chip stack are electrically connected to respective ones of the second and third conductive pad arrays of the interconnect substrate of the interconnect sub-assembly of another chip package within the chip stack.

19. The chip stack of claim 18 further comprising a base package which includes:

an interconnect substrate having opposed, generally planar top and bottom surfaces;

a sixth conductive pad array disposed on the top surface;

a seventh conductive pad array disposed on the bottom surface and electrically connected to the sixth conductive pad array;

eight and ninth conductive pad arrays disposed on the top surface on opposite sides of the, sixth conductive pad array and electrically connected thereto;

an integrated circuit chip electrically connected to the sixth conductive pad array; and the fourth and fifth conductive pad arrays of the first and second rail members of the interconnect sub-assembly of the lowermost chip package in the chip stack being electrically connected to respective ones of the eighth and ninth conductive pad arrays of the base package.

20. The chip stack of claim 19 including more than two chip packages stacked upon the base package.

21. The chip stack of claim 19 wherein the first, sixth and seventh conductive pad arrays are identically configured to each other.

22. The chip package of claim 21 wherein the second, third, fourth, fifth, eighth and ninth conductive pad arrays are identically configured to each other.

23. The chip package of claim 19 wherein:

the sixth conductive pad array comprises a tenth set of pads; and the seventh conductive pad array comprises an eleventh set of pads which are arranged in an identical pattern to the tenth set of pads such that the pads of the tenth set are aligned with respective ones of the pads of the eleventh set;

the pads of the tenth set being electrically connected to respective ones of the pads of the eleventh set.

24. The chip package of claim 23 wherein each of the pads of the eleventh set has a generally semi-spherical configuration.

25. The chip package of claim 19 wherein:

the interconnect substrate of the base package has a generally rectangular configuration defining a pair of longitudinal peripheral edge segments and a pair of lateral peripheral edge segments; and the eighth and ninth conductive pad arrays extend along respective ones of the lateral peripheral edge segments and are disposed on opposite sides of the sixth conductive pad array.

26. A stackable integrated circuit chip package, comprising:

an interconnect sub-assembly comprising:

an interconnect substrate having first and second conductive pad arrays disposed thereon, the second conductive pad array being electrically connected to the first conductive pad array;

a first rail member attached to the interconnect substrate and having a third conductive pad array disposed thereon; and a second rail member attached to the interconnect substrate and having a fourth conductive pad array disposed thereon;

the third and fourth conductive pad arrays being electrically connected to the second conductive pad array;

an integrated circuit chip electrically connected to the first conductive pad array.

27. The chip package of claim 26 wherein:

the interconnect substrate defines opposed, generally planar top and bottom surfaces;

the first conductive pad array comprises a first set of pads disposed on the top surface; and the second conductive pad array comprises second and third sets of pads disposed on respective ones of the top and bottom surfaces and arranged in identical patterns such that the pads of the second set are aligned with respective ones of the pads of the third set;

the pads of the second set being electrically connected to respective ones of the pads of the third set.

28. The chip package of claim 27 wherein the integrated circuit chip comprises:

a body having opposed, generally planar top and bottom surfaces; and a plurality of conductive contacts protruding from the bottom surface of the body;

the conductive contacts of the integrated circuit chip being electrically connected to respective ones of the pads of the first set.

29. The chip package of claim 28 wherein:

the interconnect substrate has a generally rectangular configuration defining a pair of longitudinal peripheral edge segments and a pair of lateral peripheral edge segments; and the second conductive pad array extends along the longitudinal and lateral peripheral edge segments about the body of the integrated circuit chip.

30. The chip package of claim 29 wherein:

the body of the integrated circuit chip has a generally rectangular configuration defining a pair of longitudinal sides and a pair of lateral sides; and the integrated circuit chip is sized relative to the interconnect substrate such that the longitudinal sides of the body are disposed in spaced relation to respective ones of the longitudinal peripheral edge segments of the interconnect substrate, and the lateral sides of the body are disposed in spaced relation to respective ones of the lateral peripheral edge segments of the interconnect substrate such that the body does not cover any portion of the second conductive pad array extending thereal-ong.

31. The chip package of claim 28 wherein the conductive contacts are arranged on the bottom surface of the body in an identical pattern to the first set of pads.

32. The chip package of claim 28 wherein each of the conductive contacts has a generally semi-spherical configuration.

33. The chip package of claim 32 wherein the integrated circuit chip is selected from the group consisting of:
   a flip chip device; and
   a fine pitch BGA device.

34. The chip package of claim 26 wherein the interconnect substrate is flexible.

35. The chip package of claim 34 wherein the interconnect substrate is fabricated from a polyamide.

36. The chip package of claim 26 wherein the interconnect substrate is fabricated from a ceramic material.

37. A stackable integrated circuit chip package, comprising:
   an interconnect substrate having a conductive pad array formed thereon;
   an integrated circuit chip electrically connected to the conductive pad array; and
   first and second rail members positioned upon the interconnect substrate, each of the first and second rail members having top and bottom surfaces including a conductive pad array which is electrically connected to the conductive pad array of the interconnect substrate and electrically connectable to at least one other stackable integrated circuit chip package.

38. The chip package of claim 37 wherein the interconnect substrate is flexible.

39. A method of assembling a stackable integrated circuit chip package, comprising the steps of:
   (a) electrically connecting an integrated circuit chip to a conductive pad array on an interconnect substrate; and
   (b) electrically connecting a conductive pad array on top and bottom surfaces of each of first and second rail members positioned upon the interconnect substrate to the conductive pad array of the interconnect substrate such that the conductive pad array of each of the first and second rail members is electrically connectable to at least one other stackable integrated circuit chip package.

40. The method of claim 39 wherein:
   step (a) comprises soldering the integrated circuit chip to the conductive pad array of the interconnect substrate; and
   step (b) comprises soldering the conductive pad array of each of the first and second rail members to the conductive pad array of the interconnect substrate.

41. The method of claim 39 wherein:
   step (a) comprises adhesively securing the integrated circuit chip to the conductive pad array of the interconnect substrate; and
   step (b) comprises adhesively securing the conductive pad array of each of the first and second rail members to the conductive pad array of the interconnect substrate.

42. The method of claim 41 wherein steps (a) and (b) are accomplished through the use of a conductive epoxy.

43. The method of claim 41 wherein steps (a) and (b) are accomplished through the use of a z-axis adhesive.

44. A method of assembling a chip stack, comprising the steps of:
   (a) providing a plurality of panels which each have opposed, generally planar surfaces, a plurality of openings disposed therein, and a plurality of conductive pads disposed on the opposed surfaces thereof;
   (b) providing a plurality of substrate sheets which each have opposed, generally planar surfaces and a plurality of conductive pads disposed on at least one of the opposed surfaces thereof;
   (c) providing a plurality of integrated circuit chips which each have opposed, generally planar sides and include conductive contacts protruding from one of the opposed sides thereof;
   (d) stacking one of the panels upon one of the substrate sheets such that at least some of the conductive pads of the panel are disposed on at least some of the conductive pads of the substrate sheet;
   (e) placing integrated circuit chips into respective ones of the openings of the panel such that the conductive contacts of each of the integrated circuit chips are disposed on at least some of the conductive pads of the substrate sheet;
   (f) stacking another substrate sheet upon the panel such that the substrate sheet covers the openings of the panel and the integrated circuit chips therewithin and at least some of the conductive pads of the substrate sheet are disposed on at least some of the conductive pads of the panel; and
   (g) placing integrated circuit chips upon the substrate sheet such that at least some of the conductive contacts of the integrated circuit chips are disposed on at least some of the conductive pads of the substrate sheet.

45. The method of claim 44 wherein steps (d)–(f) are repeated at least once prior to step (g).

46. The method of claim 45 further comprising the step of:
   (h) bonding the conductive contacts of the integrated circuit chips to at least some of the conductive pads of the substrate sheet upon which the integrated circuit chips are positioned, and bonding at least some of the conductive pads of each of the substrate sheets to at least some of the conductive pads of at least one of the panels.

47. A method of assembling a chip stack, comprising the steps of:
   (a) providing a plurality of panel assemblies which each comprise:
      a panel having opposed, generally planar surfaces, a plurality of openings disposed therein, and plurality of conductive pads disposed on the opposed surfaces thereof; and
      a substrate sheet having opposed, generally planar surfaces and a plurality of conductive pads disposed on least one of the opposed surfaces thereof, the panel and the substrate sheet being attached to each other such that at least some of the conductive pads of the panel are electrically connected to at least some of the conductive pads of the substrate sheet;
   (b) providing a plurality shim sheets which each have opposed, generally planar surfaces and a plurality of elongate openings disposed therein;
   (c) providing a plurality of integrated circuit chips which each have opposed, generally planar sides and include conductive contacts protruding from one of the opposed sides thereof;
   (d) placing the integrated circuit chips onto the substrate sheet of one of the panel assemblies such that the conductive contacts of each of the integrated circuit chips are disposed on at least some of the conductive pads of the substrate sheet;
   (e) stacking one of the shim sheets upon the panel assembly such that the conductive pads of the panel assembly and the integrated circuit chips are aligned with respective ones of the openings of the shim sheet and not covered thereby; and (f) stacking another panel assembly upon the shim sheet such that the panel of the subsequently stacked panel assembly is in abutting contact with the shim sheet, the integrated circuit chips are received into respective ones of the openings of the panel, and at least some of the conductive pads of the panel of the subsequently stacked panel assembly panel are aligned with the conductive pads of the substrate sheet of the remaining panel assembly.

48. The method of claim 47 further comprising the step of:

(g) placing integrated circuit chips upon the substrate sheet of the panel assembly not in abutting contact with the shim sheet such that at least some of the conductive contacts of the integrated circuit chips are disposed on at least some of the conductive pads thereof.

49. The method of claim 48 wherein steps (d)–(f) are repeated at least once prior to step (g).

50. The method of claim 49 further comprising the step of:

(h) bonding the conductive contacts of the integrated circuit chips to at least some of the conductive pads of the substrate sheets of the panel assemblies upon which the integrated circuit chips are positioned, and bonding at least some of the conductive pads of the panel assemblies to each other.

51. A stackable integrated circuit chip package, comprising:

an interconnect substrate having first, second and third conductive pad arrays disposed thereon, the second and third conductive pad arrays being electrically connected to the first conductive pad array;

an integrated circuit chip electrically connected to the first conductive pad array;

a first rail member having a fourth conductive pad array disposed thereon; and a second rail member having a fifth conductive pad array disposed thereon;

the fourth and fifth conductive pad arrays being electrically connected to respective ones of the second and third conductive pad arrays.

52. A stackable integrated circuit chip package, comprising:

an interconnect substrate having first and second conductive pad arrays disposed thereon, the second conductive pad array being electrically connected to the first conductive pad array;

an integrated circuit chip electrically connected to the first conductive pad array;

a first rail member having a third conductive pad array disposed thereon; and a second rail member having a fourth conductive pad array disposed thereon;

the third and fourth conductive pad arrays being electrically connected to the second conductive pad array.

53. A chip stack comprising:

at least two stackable integrated circuit chip packages, each of the chip packages comprising:

an interconnect substrate having first, second and third conductive pad arrays disposed thereon, the second and third conductive pad arrays being electrically connected to the first conductive pad array;

an integrated circuit chip electrically connected to the first conductive pad array;

a first rail member having a fourth conductive pad array disposed thereon; and a second rail member having a fifth conductive pad array disposed thereon, the fourth and fifth conductive pad arrays being electrically connected to respective ones of the second and third conductive pad arrays;

the chip packages being assembled in the chip stack such that the fourth and fifth conductive pad arrays of the first and second rail members of one of the chip packages within the chip stack are electrically connected to respective ones of the second and third conductive pad arrays of the interconnect substrate of another chip package within the chip stack.

54. A method of assembling a chip stack, comprising the steps of:

(a) providing a plurality of panel assemblies which each comprise:

a panel having opposed, generally planar surfaces, a plurality of openings disposed therein, and a plurality of conductive pads disposed on the opposed surfaces thereof;

a substrate sheet having opposed, generally planar surfaces and a plurality of conductive pads disposed on at least one of the opposed surfaces thereof; and a shim sheet having opposed, generally planar surfaces and a plurality of elongate openings disposed therein, the substrate sheet and the shim sheet being attached to respective ones of the opposed surfaces of the panel such that at least some of the conductive pads of the panel are electrically connected to at least some of the conductive pads of the substrate sheet, and the openings and at least some of the conductive pads of the panel are aligned with respective ones of the openings of the shim sheet;

(b) providing a plurality of integrated circuit chips which each have opposed, generally planar sides and include conductive contacts protruding from one of the opposed sides thereof;

(c) placing the integrated circuit chips onto the substrate sheet of one of the panel assemblies such that the conductive contacts of each of the integrated circuit chips are disposed on at least some of the conductive pads of the substrate sheet; and (d) stacking another panel assembly upon the initial panel assembly such that the shim sheet of the subsequently stacked panel assembly is in abutting contact with the substrate sheet of the initial panel assembly, the integrated circuit chips are received into respective ones of the openings of the panel of the subsequently stacked panel assembly, and at least some of the conductive pads of the panel of the subsequently stacked panel assembly are aligned with the conductive pads of the substrate sheet of the initial panel assembly.

55. The method of claim 54 further comprising the step of:

(e) placing integrated circuit chips upon the substrate sheet of the subsequently stacked panel assembly such that at least some of the conductive contacts of the integrated circuit chips are disposed on at least some of the conductive pads thereof.

56. The method of claim 55 wherein steps (c) and (d) are repeated at least once prior to step (e).

57. The method of claim 56 further comprising the step of:

(f) bonding the conductive contacts of the integrated circuit chips to at least some of the conductive pads of the substrate sheets of the panel assemblies upon which the integrated circuit chips are positioned, and bonding at least some of the conductive pads of the panel assemblies to each other.

* * * * *